(12) United States Patent
Menkhoff et al.

(10) Patent No.: US 9,450,622 B2
(45) Date of Patent: Sep. 20, 2016

(54) CIRCUIT AND METHOD FOR PROVIDING A RADIO FREQUENCY SIGNAL

(71) Applicant: Intel IP Corporation, Santa Clara, CA (US)

(72) Inventors: Andreas Menkhoff, Oberhaching (DE); Andreas Langer, Lohhof (DE); Staffan Sahlin, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/856,781

(22) Filed: Sep. 17, 2015

(65) Prior Publication Data

US 2016/0182100 A1 Jun. 23, 2016

(30) Foreign Application Priority Data

Dec. 23, 2014 (DE) .................. 10 2014 119 625

(51) Int. Cl.
| | |
|---|---|
| *H04B 1/62* | (2006.01) |
| *H04B 1/04* | (2006.01) |
| *H04B 1/00* | (2006.01) |
| *H04W 72/08* | (2009.01) |

(52) U.S. Cl.
CPC .......... *H04B 1/0475* (2013.01); *H04B 1/0078* (2013.01); *H04W 72/082* (2013.01); *H04B 2001/0416* (2013.01)

(58) Field of Classification Search
CPC ..... H04L 25/49; H04L 27/36; H04L 27/366; H04L 27/367; H04L 27/368; H04B 2001/0408; H04B 2001/0416; H04B 2001/0425; H04B 2001/0433; H04B 2001/0441; H04B 2001/045; H04B 1/62; H03F 1/32; H03F 1/3241; H03F 1/3247; H03F 2201/3221; H03F 2201/3224; H03F 2201/3227; H03F 2201/3231; H03F 2201/2333

USPC ........... 375/295, 296, 297; 455/114.1, 114.2, 455/114.3

See application file for complete search history.

(56) References Cited

U.S. PATENT DOCUMENTS

| | | | | |
|---|---|---|---|---|
| 5,852,630 | A * | 12/1998 | Langberg ............ | H04L 27/2647 375/219 |
| 8,909,175 | B1 * | 12/2014 | McCallister .......... | H04L 27/368 330/127 |
| 2009/0088093 | A1 | 4/2009 | Nentwig | |
| 2013/0072139 | A1 * | 3/2013 | Kang ................... | H04B 1/0475 455/114.3 |
| 2015/0031318 | A1 * | 1/2015 | McCallister .......... | H03F 1/3247 455/114.3 |
| 2015/0088445 | A1 * | 3/2015 | Wills .................... | H03F 1/0222 702/66 |

FOREIGN PATENT DOCUMENTS

WO 2015/006441 A2 1/2015

* cited by examiner

*Primary Examiner* — Siu Lee
(74) *Attorney, Agent, or Firm* — Eschweiler & Associates, LLC

(57) ABSTRACT

A circuit for generating a radio frequency signal includes an amplifier configured to provide a radio frequency signal, the radio frequency signal being based on a baseband signal and a power supply configured to provide a variable supply voltage to the amplifier. A predistortion circuit is configured to modify the baseband signal; and a control circuit configured to control an operation mode of the predistortion circuit depending on a bandwidth of a radius of the baseband signal.

19 Claims, 14 Drawing Sheets

CIRCUIT AND METHOD FOR PROVIDING A RADIO FREQUENCY SIGNAL

REFERENCE TO RELATED APPLICATION

This application claims priority to German Application number 10 2014 119 625.2 filed on Dec. 23, 2014, the contents of which are incorporated by reference in their entirety.

BACKGROUND

To increase efficiency of amplifier circuits or power amplifiers within, for example, cellular handsets, envelope tracking may be used. In envelope tracking systems, the bias current of a power amplifier is dynamically altered so that the power amplifier is operated in a power-efficient state or operation mode for the present input signal and the presently required output power. The chosen bias current is, therefore, coupled with or dependent on the present envelope of the input signal.

For wide band signals of modern cellular systems, as for example long-term evolution (LTE) 20 MHz, the envelope of the input signal to the power amplifier may have a high bandwidth. Most of the signal energy of the amplitude modulated (AM) signal is contained within +/- the bandwidth (BW) of the transmit (TX) signal, i.e. within the bandwidth of the used channel. However, the high frequency components of the AM signal are still relevant to achieve an acceptable transmitter noise performance outside of the bandwidth of the transmitter channel, in order to comply with adjacent channel leakage ratio (ACLR) requirements of the system, to avoid spurious emissions or to not transmit excessive noise at the duplex distance (at the frequency of the received band). In order to comply with those requirements, the envelope tracking system is required to have a high bandwidth to be able to follow also fast envelope changes due to the high frequency components of the AM signal, resulting in power consuming envelope tracking systems, which counterbalances the benefits of the envelope tracking of the power amplifier and reduces the efficiency of the whole system. For present wide band systems, sufficient bandwidth of the envelope tracking system may be principally unfeasible, resulting in potentially unacceptable noise contributions to the amplified radio frequency signal. Hence, there is a requirement to increase a performance of envelope tracking systems.

BRIEF DESCRIPTION OF THE DRAWINGS

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while further embodiments are capable of various modifications and alternative forms, some example embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of further example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
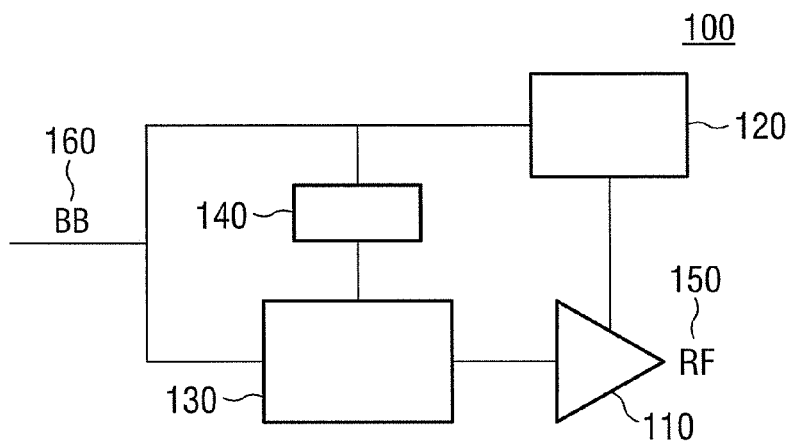
FIG. 1 illustrates an example of a circuit or generating a radio frequency signal.

A circuit 100 for generating a radio frequency signal 150 according to an example is illustrated in FIG. 1. The circuit 100 comprises an amplifier 110, a power supply 120, a pre-distortion circuit 130 and a control circuit 140.

The amplifier 110 is configured to provide a radio frequency signal 150 which is based on a baseband signal 160. The power supply 120 is configured to provide a variable supply voltage to the amplifier 110 to operate the amplifier 110 with different supply voltages and within operation modes of different efficiency, given the presently processed baseband signal 160. The pre-distortion circuit 130 is configured to modify the baseband signal 160. The modification may be used to compensate for amplification gain variations of the amplifier 110 which result from using varying supply voltages. For example, when an amplification gain of the amplifier 110 is increased due to an increase of the supply voltage provided by the power supply 120, the pre-distortion circuit 130 may decrease the energy within the baseband signal in order to maintain the desired power of the provided radio frequency signal 150 constant.

According to the example illustrated in FIG. 1, the control circuit 140 is configured to control the operation mode of the pre-distortion circuit 130 depending on a bandwidth of a radius of the baseband signal 160. Controlling the pre-distortion circuit 130 and its operation mode depending not only on a gain variation of the amplifier 110 but also on the bandwidth of the radius of the baseband signal 160 may allow to compensate deviations from the desired linear gain of the amplifier 110 which may be caused by the fact that the supply voltage of the amplifier 110 cannot be adjusted as fast as the present bandwidth of the radius of the baseband signal 160 would require. Conventionally, the supply voltage provided by the power supply 120 would be required to follow the radius of the baseband signal 160 at every time instant. If, however, the radius changes too quickly and the bandwidth of the radius of the baseband signal 160 is too high, power supplies 120 may not be able to follow the quick change. As a result, there could be a mismatch between the supply voltage required to follow the present envelope of the baseband signal 160 and the actually provided supply voltage, resulting in noise components within the radio frequency signal 150 which may be outside the transmission band and violate the required spectral mask. To this end, a radius of the baseband signal may be understood to be the instantaneous radius r of a complex valued baseband signal $re^{i\phi}$, i.e. a magnitude of the presently observed sample of the baseband signal. If the baseband signal is processed by individually processing its in-phase component I and its quadrature component Q, like in some amplifier circuits or transmitter architectures, the radius of the baseband signal may be determined by evaluating $r=\sqrt{I^2+Q^2}$. It is important to note that, while the bandwidth of the I component and the Q component may be limited to a desirable maximum, the bandwidth of the resultant radius of the baseband signal and hence the bandwidth of the envelope of the resulting radio frequency signal may exceed the desirable maximum by a considerable amount due to the previous relationship between the radius and I and Q. However, due to the interrelationship between r and I, Q, examples described herein may be applied to arbitrary circuits or amplifier/transmitter architectures, irrespective whether they internally use an I, Q representation or an r, $\phi$ representation of the baseband signal.

By controlling the operation mode of the pre-distortion circuit 130 depending on the bandwidth of the radius of the baseband signal 160, however, the mismatch of a desirable gain of the amplifier 110 and the presently achievable gain of the amplifier 110, which depends on the supply voltage presently provided by the power supply 120, can be anticipated and appropriately considered within the pre-distortion circuit 130 so that the additional noise generation may be reduced or even completely suppressed.

In general terms, the control circuit 140 is configured to control the amount of the modification by the pre-distortion circuit 130. According to some examples, the pre-distortion circuit 130 is configured to increase the amount of the modification if the bandwidth of the radius of the baseband signal 160 increases. According to some examples, the pre-distortion circuit 130 is configured to modify the radius of the baseband signal 160 in order to mitigate the undesirable effects of the amplifier 110 in case of a lower bandwidth of the power supply 120 or its associated envelope tracking circuitry. In at least some of the examples, the control circuit 140 is configured to control the operation mode of the pre-distortion circuit 130 such that an energy variation within the radio frequency signal 150 caused by the variation of the supply voltage is compensated by an energy variation within the baseband signal 160 caused by the pre-distortion circuit 130, e.g. by appropriately modifying the radius of the baseband signal 160.

According to some examples, a high frequency component of the radius of the baseband signal 160 is used within the pre-distortion circuit 130 to determine the modification of the baseband signal. If the high frequency component is chosen such that it represents or corresponds to the fast radius changes which cannot be followed by the power supply 120, a modification to the baseband signal can be introduced which depends on the portion of the radius change which cannot be followed by the power supply 120. To this end, the modification of the baseband signal 160 may be performed such that the amplifier's 110 spectral deterioration of the signal components can be partly or completely anticipated, resulting in a radio frequency signal 150 being generated with little or no additional noise components caused by the envelope shaping and hence being compliant with the spectral requirements.

Further, this even allows to deliberately use a power supply 120 with intrinsically low bandwidth without having negative impacts on the quality of the radio frequency signal 150. The power supply 120 and its associated control circuitry, i.e. the envelope tracking circuit, may also be actively band-limited, for example, by using a low-pass filtered baseband signal or its radial component as an input to the envelope tracking circuit. Alternatively, the intrinsic low-pass filter characteristic of the power supply 120 may be considered within the control circuit 140 so as to allow the control circuit 140 to appropriately control the operation mode of the pre-distortion circuit 130 depending on the present or instantaneous bandwidth of the radius of the baseband signal 160. According to some examples, therefore, the control circuit 140 is configured to control the operation mode of the pre-distortion 130 circuit using information on a low-frequency portion of the radius of the baseband signal 160 while the pre-distortion circuit 130 is configured to determine the modification of the baseband signal 160 using a high frequency component of the radius of the baseband signal 160. In this context, the instantaneous bandwidth of the radius of the baseband signal or the instantaneous bandwidth of the baseband signal is to be understood as the present bandwidth of the signal, i.e. the bandwidth within a given short time interval of the transmission according to one standard or setup (e.g. according to LTE 20). This should not be confused with different bandwidths associated to the baseband signals of different Mobile telecommunication standards.

In some examples, the high-frequency component of the radius of the baseband signal 160 is complementary to the low-frequency component of the radius of the baseband signal 160 used by the control circuit 140. That is, the low-frequency component and the high-frequency component of the radius of the baseband signal 160, when joined together, form the full bandwidth radius of the baseband signal 160. In being complementary to each other, the high-frequency component of the radius of the baseband signal 160, which is the component which is not considered by the envelope tracking circuit or the power supply 120 can be appropriately modified by the pre-distortion circuit so that the modification anticipates the full influence of the amplifier 110 on those signal components.

Figure 2:
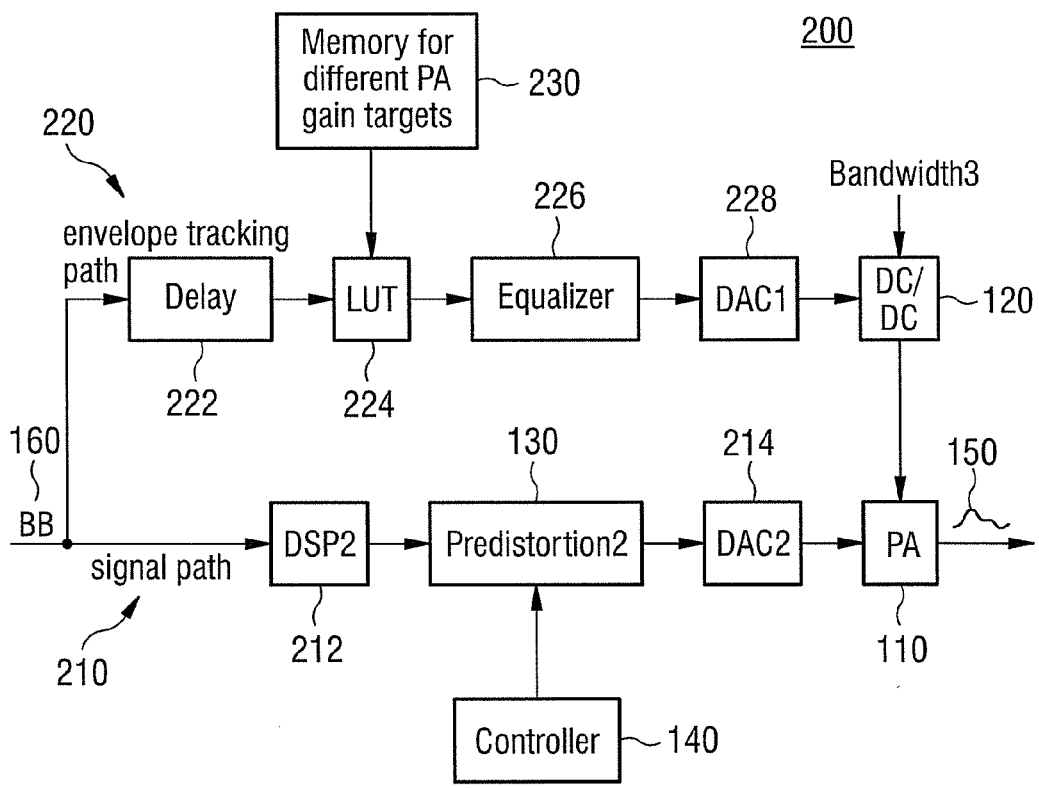
FIG. 2 illustrates a further example of a circuit in more detail.

FIG. 2 illustrates a further example of a circuit for generating a radio frequency signal comprising an amplifier 110 and employing envelope tracking. The circuit 200 comprises a signal processing path 210 where the baseband signal 160 is processed and an envelope tracking path 220 where the information related to the generation of the variable supply voltage by means of the power supply 120 is generated.

Within the signal processing path 210, the baseband signal 160 may be optionally processed by means of a digital signal processor 212 before being modified by the pre-distortion circuit 130. The pre-distorted baseband signal is provided to a digital-to-analog converter 214 in order to convert the digital baseband signal into an analog signal before being input into the amplifier 110, which amplifies the analog signal to provide the radio frequency signal 150.

The amplifier 110 is operated with a variable supply voltage provided by the power supply 120. Within the envelope tracking path 220, a delay element 222 may optionally serve to compensate for delays within the signal processing path 210, for example, within the pre-distortion circuit 130 so as to provide the varying supply voltage in synchronization with the corresponding analog signals at the amplifier 110. The delayed input samples of the baseband signal 160 are used to determine the presently desirable supply voltage (being equivalent to a resulting gain factor for the amplifier 110). In a particular efficient implementation, the determination of the presently-desirable supply voltage may be implemented using a look-up table 224, associating a radius of the baseband signal 160 to a desired supply voltage or to a desired gain target, which is equivalent. This supply voltage may, as illustrated in FIG. 2, for example be generated by using a digital-to-analog converter 228 converting a digital quantity as provided by the look-up table 224 into an analog signal used to control, for example, a DC/DC-converter as the power supply 120. In the particular example of FIG. 2, an optional equalizer 226 is present to adapt the bandwidth of the output samples of the look-up table 224 to the dynamic capabilities of the DC/DC converter 120. The DC/DC converter or the power supply 120 may have an inherent low pass characteristic, i.e. its bandwidth may be limited. That is, the possible variation of supply voltage within a given time interval is limited.

While the example of FIG. 2 assumes that the baseband signal 160 is provided in a polar representation so that the envelope tracking circuit 220 may directly operate on the radius of the baseband signal, further examples may use an I/Q representation instead, deriving the radius prior to an input to the envelope tracking circuit 220 or within the envelope tracking circuit 220 by evaluating $r=\sqrt{I^2+Q^2}$. Likewise, the radius of the baseband signal 210 to be modified by the predistortion circuit 130 may be determined within or prior to the predistortion circuit 130. To this end, in I/Q modulator designs, the radius r would be determined from the I and Q components of the baseband signal 160 and the predistortion circuit 130 would modify the radius of the baseband signal 160 before the modified radius id used to again determine an I component and a Q component for the further processing within the signal processing path of an I/Q modulator using an example of a predistortion circuit as described herein.

Depending on the supply voltage and the desired output power of the radio frequency signal 160, different gain targets for the amplifier 110 can be distinguished. A gain target corresponds to the power contribution of the amplifier 110 to the resulting radio frequency signal 150. For example, it may be chosen, whether the amplifier 110 operates in saturation or with high gain. When the amplifier 110 is operated in deep saturation at a high output power, the amplifier operates with a high efficiency and an energy loss caused by the amplifier may be low. The high efficiency, however, results in a slower reaction or a slower dynamic behavior of the amplifier 110, which results in increased memory effects at varying input voltages. Alternatively, the amplifier 110 may be operated at a high gain (PA gain). In this range or operation mode, the amplifier 110 reacts faster to varying voltages. Hence, the bandwidth of the baseband signal 160 to be processed can be used to choose between different operation modes of the amplifier 110. A high efficiency of the system may be achieved when the bandwidth of the baseband signal is comparatively small by choosing to operate the amplifier in saturation. Further, a good noise characteristic of the resultant radio frequency signal 150 may be achieved even if the instantaneous bandwidth or the bandwidth of the present baseband signal 160 is comparatively high, by choosing to operate the amplifier 110 with high gain.

According to some examples, different gain targets and, hence, supply voltages are chosen for the same input sample size or input amplitude of the baseband signal 160, when the instantaneous bandwidth of the baseband signal is different. This may, for example, be achieved by using different look-up tables 224 for different bandwidths of the baseband signal 160. In other words, an envelope tracking circuit 220 may control the power supply 120 based on the instantaneous bandwidth of the baseband signal 160.

In general, there are at least two positions within the envelope tracking circuit 220 where the bandwidth of the envelope tracking circuit 220 or path can be adjusted depending on the instantaneous bandwidth of the baseband signal 160, i.e. of the transmit signal. Introducing different gain targets for the amplifier 110, i.e. different supply voltages to be supplied by the power supply 120, may be achieved by using different look-up tables 224 for different signal bandwidths. To this end, a memory 230 may be used to store the different look-up tables to be used depending on the bandwidth of the baseband signal 150. For example, for a low bandwidth, the amplifier 110 can be driven towards deep saturation, while for a high bandwidth it may be used in a less saturated mode so that the amplifier 110 can react faster. Since the amplifier 110 has then different gain for different input/output values, this should be compensated within the digital data path (the signal processing path 210) by modifying the baseband signal 160 so that the resulting varying amplifier gain times the varying input gain remains constant and the desired energy within the radio frequency signal 150 can be maintained.

Likewise, also the power supply 120 may be utilized in different operation modes with different efficiency. For example, the power supply 120 of the DC/DC converter may be set to a slow/high efficiency mode for a low bandwidth and to a fast/low efficiency mode for a high bandwidth of the baseband signal or the transmit signal. In other words, the envelope tracking circuit 220 may be configured to switch the power supply 120 from a first operation mode to a second operation mode if the bandwidth of the radius of the baseband signal 160 exceeds a threshold, wherein the power supply 120 operates with a lower bandwidth and a higher efficiency in the first operation mode than in the second operation mode.

When the gain target for defining the contribution of the energy within the radio frequency signal 150 caused by the amplifier 110 depends on the instantaneous bandwidth of the baseband signal 160, an operation of a pre-distortion circuit 130 is depending on the bandwidth of the radius of the baseband signal 160.

According to some examples, the control circuit 140 is configured to control the operation mode of the pre-distortion circuit 130 such that an energy variation within the radio frequency signal 150 caused by the variation of the supply voltage (and hence the contribution of the amplifier 110 to the energy within the radio frequency signal 150) is compensated by an energy variation within the baseband signal 160 caused by the pre-distortion circuit 130. That is, the control circuit 140 is configured to control an operation mode of the pre-distortion circuit 130 depending on the bandwidth of the radius of the baseband signal 160. If, for example, the bandwidth of the baseband signal 160 becomes low, the amplifier 110 may be operated in deep saturation and, hence, with low gain. The pre-distortion circuit 130 is controlled to compensate this by choosing an appropriate pre-distortion in order to introduce additional energy into the baseband signal 160 based on its high frequency components so as to maintain the product of both linearly.

Figure 3A:
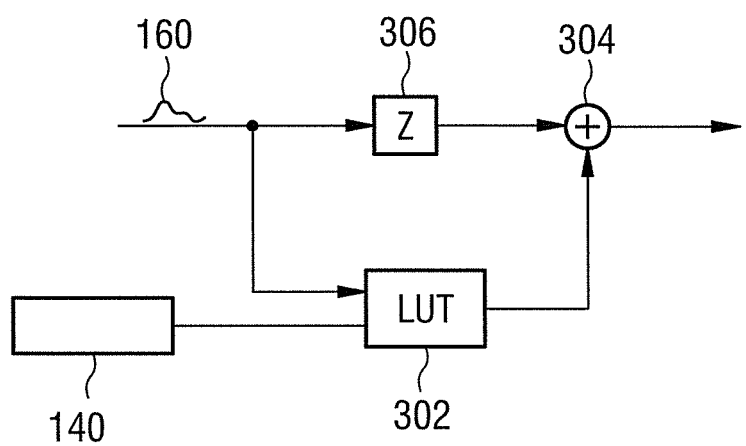
FIGS. 3a and b illustrate an examples for a pre-distortion circuit usable within one of the circuits of FIG. 1 or 2.
Figure 3B:
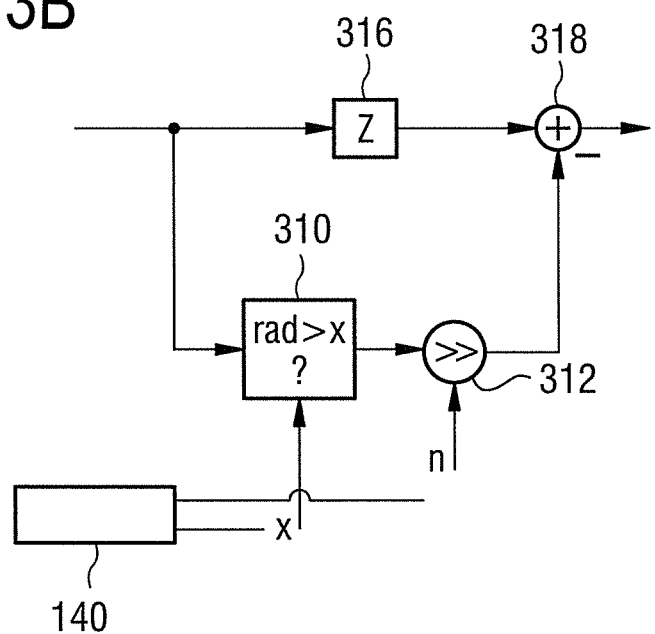

FIGS. 3a and 3b illustrate two possible implementations of a pre-distortion circuit 130 in order to modify the baseband signal 160 depending on its bandwidth. In the implementation of FIG. 3a, a look-up table 302 is used to add a modification to the baseband signal 160 by means of an adder 304. In order to allow for the look-up operation, an additional delay 306 is present delaying the input samples of the baseband signal 160 while the look-up operation is performed. The controller 140 serves to choose different look-up tables for different signal bandwidths to appropriately consider the varying gain targets of the amplifier 110, which also depend on the bandwidth of the baseband signal 160.

A further example is illustrated in FIG. 3b, where the controller is used to provide different thresholds x and shifting parameters n to a comparator 310 and a shift register 312. For a given bandwidth, a threshold x for a radius sample or a given amplitude of the baseband signal is determined. The samples of a digital baseband signal exceeding the threshold are modified by subtracting a quantity depending on the shift parameter n by means of an adder 318.

Figure 7:
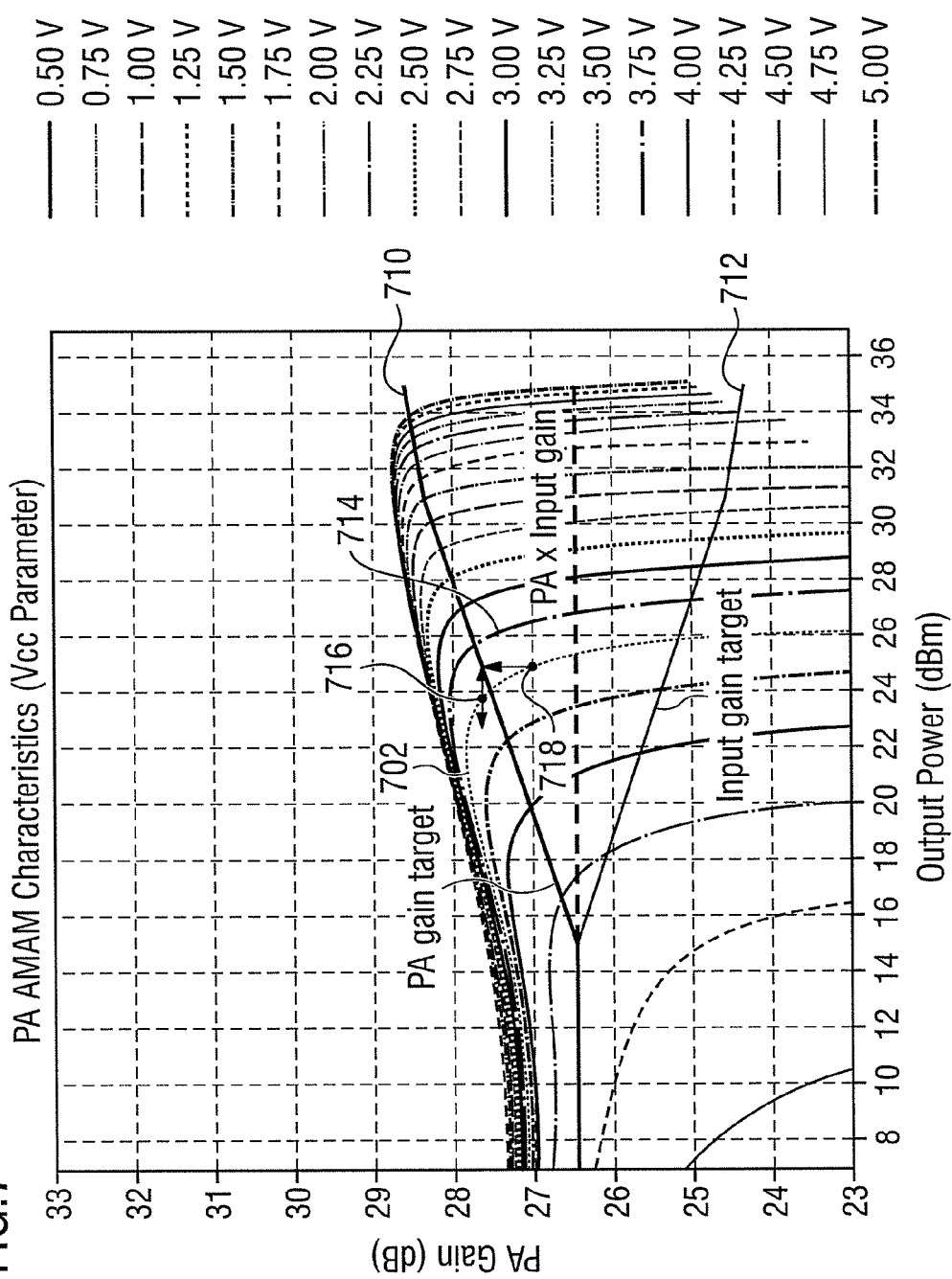
FIG. 7 illustrates an example for a scheme to control the operation of the pre-distortion circuit when operating the power amplifier with a high gain.
Figure 8:
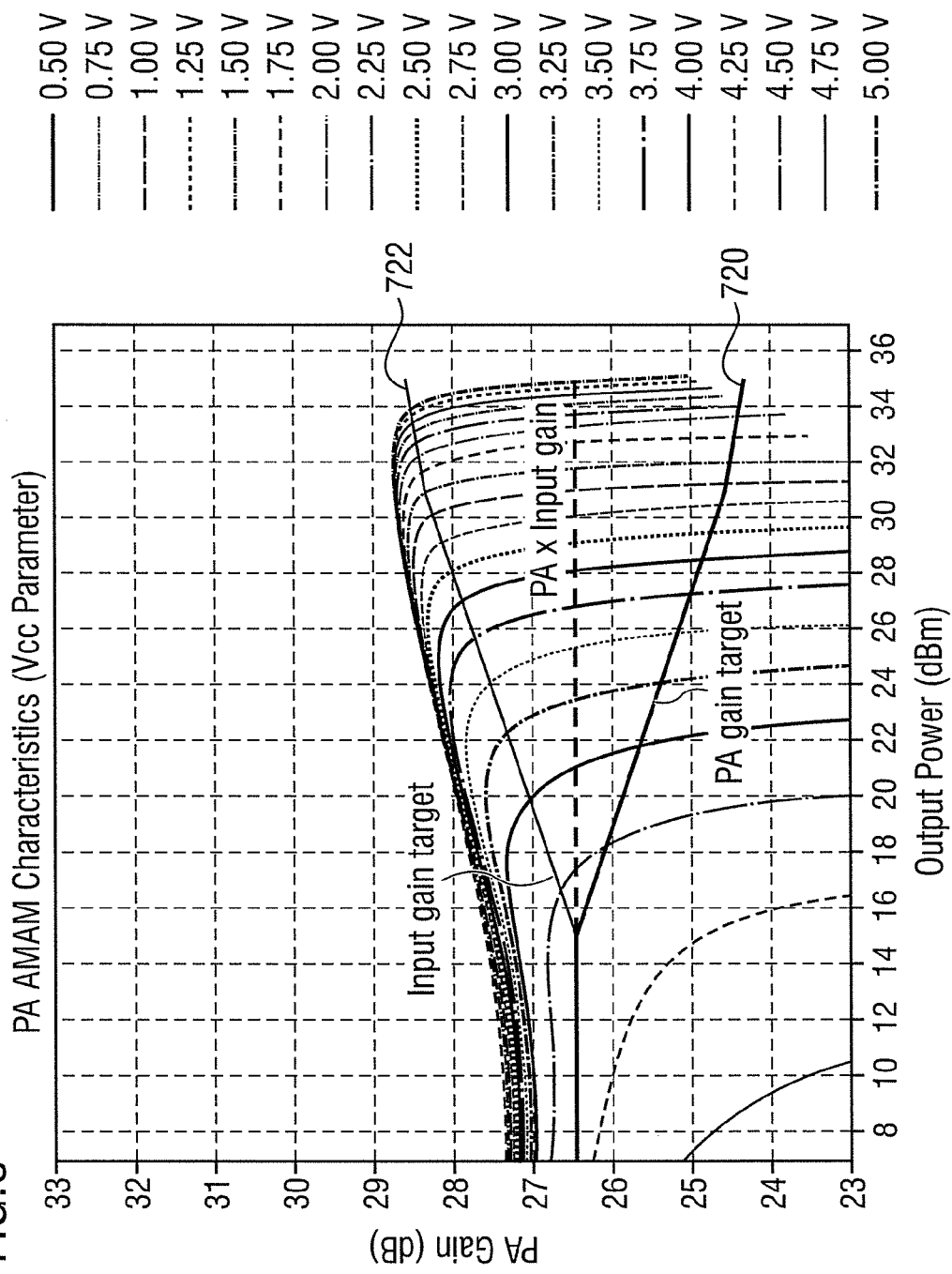
FIG. 8 shows another example for a scheme to control the operation of the pre-distortion circuit when operating the power amplifier in saturation.

The illustrations of FIGS. 7 and 8 illustrate two examples for different gain characteristics and associated modifications of the baseband signal which may be used at different bandwidths of the baseband signal. The required output power of the radio frequency signal 150 is given on the X-axis, while the gain contribution of the amplifier 110 is given on the Y-axis. The diagrams further illustrate a multiplicity of gain curves for different supply voltages to the amplifier 110, as for example gain-curve 702. The gain target for the amplifier 110 is illustrated by amplifier gain target 710, while the corresponding input gain target is given by input gain target curve 712. The gain target of the amplifier 110 corresponds to the supply voltage provided to the amplifier 110. The amplifier gain target 710 for the amplifier 110 is, for example, implemented by using look-up table 224 within the envelope tracking circuit 220. Likewise, the input gain target 712 indicating the required modification of the baseband signal, may be implemented using a corresponding look-up table (LUT) 302 within the pre-distortion circuit 130. Depending on the bandwidth, different corresponding pairs of amplifier gain target 710 and input gain target 712 may be used, as illustrated in FIGS. 7 and 8. That is, depending on the bandwidth of the baseband signal, different pairs of corresponding look-up tables 302 and 224 may be used within the pre-distortion circuit 130 and the envelope tracking circuit 220, respectively.

In the event illustrated in FIG. 7, the amplifier gain target 710 is optimized to high gain contributions or high PA gain for a given DC supply voltage. In the high gain region, the amplifier 110 (PA) reacts faster to varying voltages so that the power supply 120 (DC/DC converter) remains as a main contributor to an overall low-pass characteristic of the system. The input gain target 712 is adjusted inversely to the amplifier gain target 710 so that the product of both remains linear. In other words, given an amplifier gain target 710, the control circuit 140 is configured to control the operation mode of the pre-distortion circuit 130 such that an energy variation within the radio frequency signal 150 caused by a variation of the supply voltage of the power supply 120 is compensated by an energy variation within the baseband signal 160, which is caused by the pre-distortion circuit 130. In the event of high gain targets for the amplifier as illustrated in FIG. 7, the crest factor for the digital-to-analog converter 228 can be higher for a higher output power so that the digital-to-analog converter (DAC) 228 has less distortions at a higher output power.

In the setting illustrated in FIG. 8, the amplifier gain target 720 is chosen to come to deep saturation at high output powers, optimizing the efficiency of the system and so reducing energy losses. In this regime, the amplifier 110 reacts slower and shows more memory effects caused by varying voltages. Like in the setting illustrated in FIG. 7, the input gain target 722 is adjusted inversely to the amplifier gain target 720 so that the product of both remains linear.

FIGS. 7 and 8 illustrate, as to how the pre-distortion circuit 130 may be configured to modify the baseband signal 150 depending on the instantaneous bandwidth of the envelope of the baseband signal 150, allowing to achieve both, saving energy when the bandwidth allows while providing a high quality radio frequency signal at all times.

In summary, the need to compromise is reduced when using examples described herein, as compared to conventional approaches having only one configuration being a compromise for all use cases, where a system engineer has to find a compromise between DC/DC converter efficiency, amplifier saturation and bandwidth of the transmit signal once and forever. The need to find a compromise in conventional approaches is due to the fact that the DC/DC converter changing the supply voltage for the amplifier according to the envelope (or radial component) of the polar output signal has a limited bandwidth itself. Increasing the bandwidth of the DC/DC converter or power supply 120 as a permanent design option loses efficiency and energy is unnecessarily consumed by the DC/DC converter. Some higher tracking bandwidth of, for example, more than 2 MHz, may not be followable by the DC/DC converter at all. Likewise, when using the power amplifier 110 in deep saturation, the efficiency of the amplifier 110 is high, making the amplifier react slowly, however. To compensate for this, tracker bandwidth, i.e. the bandwidth of the envelope tracking circuit 210 or the power supply 120 would have to be increased, time synchronization would have to be more precise in order to avoid memory effects to get more visible.

In processing or pre-distorting the baseband signal 160 depending on its bandwidth (the instantaneous bandwidth at a given time), a more inefficient operation needs to be accepted only at time instants where the bandwidth of the baseband signal 160 or the transmit signal indeed requires so. For example, the gain target for the amplifier 110 may be set to a higher saturation for a low bandwidth and to a lower saturation for transmitting high bandwidth, as illustrated by means of FIGS. 7 and 8. In LTE systems, the bandwidth depends, for example, on the number of resource blocks presently used or transmitted.

According to further examples, it may be deliberately accepted that the supply voltage cannot be adjusted according to the gain target due to the limited bandwidth of the envelope tracking circuit 220 and/or the power supply 120. The resulting spectral distortions are, according to some examples, anticipated and avoided by appropriate pre-distortion of the baseband signal. This may particularly be achieved in that the pre-distortion circuit 130 is configured to determine the modification of the baseband signal using a high-frequency component of the baseband signal 160. Using a high-frequency component to determine the modification of the baseband signal 160 allows to determine the modification based on the component of the signal which has a too high frequency to be followed by the power supply 120 due to its limited bandwidth. According to further examples, the portion of the signal which cannot be followed by the envelope tracking circuit is not necessarily due to the inherent low-pass characteristics of the power supply, but may also be determined by the filter characteristics of further components within the envelope tracking circuit.

Due to either cause, the envelope tracking circuit 220 is, generally speaking, configured to control the power supply 120 based on a low-frequency component of the radius of the baseband signal 160.

Figure 4A:
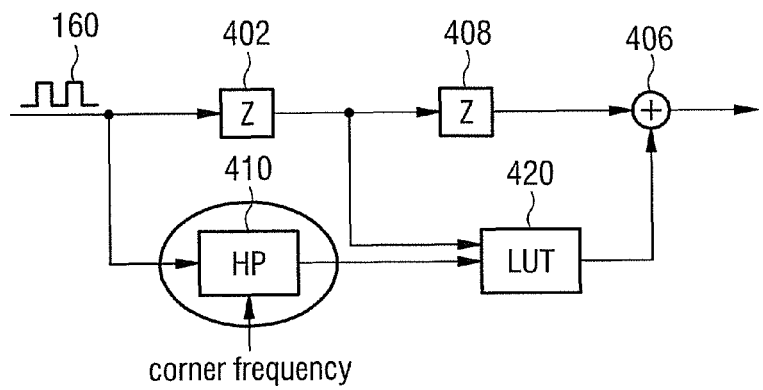
FIGS. 4A to 4C illustrate further examples for pre-distortion circuits usable within one of the circuits of FIG. 1 or 2 and considering a high frequency component of the baseband signal.
Figure 4B:
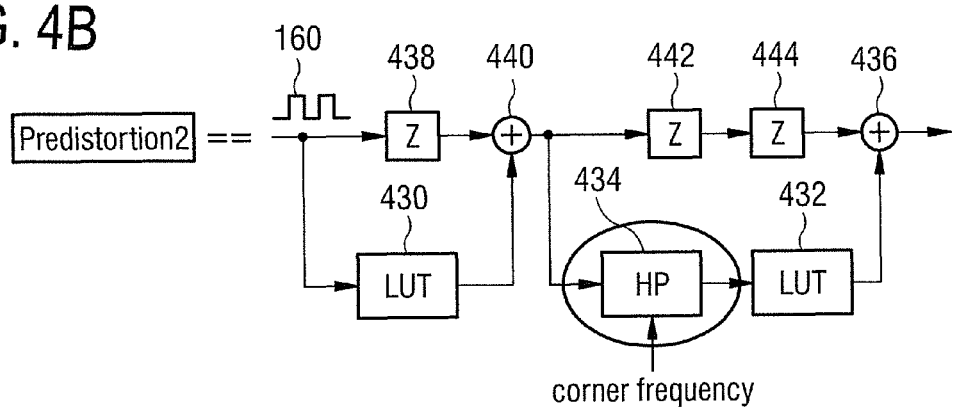
Figure 4C:
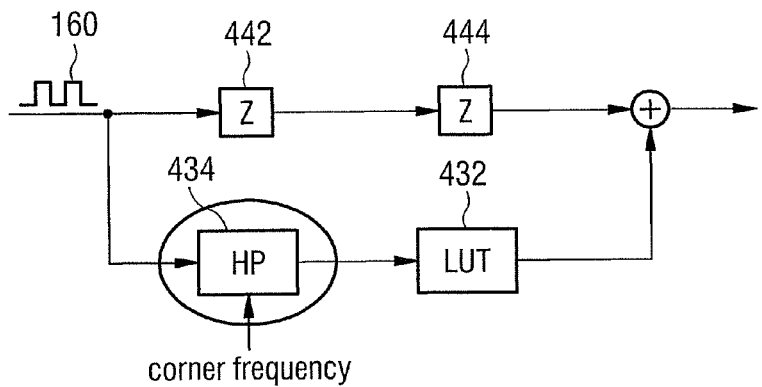

The basic principle is explained again referencing FIG. 7, while FIGS. 4A to 4C give some examples, as to how pre-distortion circuits 130 may be implemented to allow to base the modification of the baseband signal on an appropriately-chosen high frequency component of the baseband signal. If the bandwidth of the radius of the baseband signal is, under normal conditions, relatively small, the envelope tracking circuit and the power supply 120 is able to follow the radius of the signal path, i.e. of the baseband signal. If the radius of the amplitude modulated baseband signal 150, i.e. its amplitude, increases, the envelope tracking circuit 220 increases the supply voltage to the amplifier 110, making the amplifier 110 provide a higher output power due to the increased supply voltage. In the event of a voltage-controlled DC/DC converter, this may be achieved by increasing an input voltage to the DC/DC converter, as illustrated in FIG. 2, where the digital-to-analog converter 228 is used to do so. Turning to the gain curve 702 in FIG. 7, it becomes apparent that, with increasing output power, one moves to the right on the amplifier's gain curve 702. Likewise, with decreasing output power, one would move to the left, if a supply voltage is not changed. In principle, one would like to move along the amplifier's gain target curve 710 to neighboring supply voltages but, due to the limited bandwidth of the DC/DC converter, this is not always possible, depending on the desired speed of the voltage change. Further, there may also be scenarios, where one would like to actively limit the bandwidth of the DC/DC converter since slow DC/DC converters have better efficiency. If the instantaneous bandwidth of the envelope or radius of the baseband signal 150 becomes too high, the envelope tracking circuit might 220 only be able to partly follow the change of the radius or, even not be able to follow at all.

As an example, an input power change starting from stable conditions at the operating point 716 illustrated in FIG. 7, shall be considered. The operating point 716 corresponds to a supply voltage of 1.75 V of gain curve 702. In particular, an output power of 24 dB is realized by a gain of the amplifier 110 of 27.5 dB. Therefore, the input power, i.e. the power of the baseband signal, given by its present radius, should be −3.5 dB. If one would like to increase the output power to 24.8 dB, as illustrated by the output power target 718 in FIG. 7, one would like to follow the gain curve 702 to end up at a supply voltage of 1.875 V. If, however, the input signal changes too fast, i.e. if the bandwidth of the radius of the baseband signal is too high, the envelope tracking circuit 220 may not be able to provide the corresponding change of the supply voltage in the required time. Assuming that the bandwidth is so high that the envelope tracking circuit cannot provide a voltage change at all, the output power of 24.8 dB is achievable by an amplifier gain of 27 dB, corresponding to the gain provided by the amplifier at a maintained supply voltage of 1.75 V, and an increase of the input power of the baseband signal to −2.2 dB (i.e. by an increase of 1.3 dB). That is, in order to compensate for a lack of required output power due to the cause that the supply voltage of the power supply 120 cannot be changed quickly enough, the input power of the baseband signal is increased within the data path by 1.3 dB. That is, the pre-distortion circuit 130 would be configured to determine the modification of the baseband signal 150 using a high frequency component of the baseband signal such that an energy variation within the radio frequency signal 150 by the variation of the supply voltage or by the limited bandwidth of the power supply is compensated by an energy variation within the baseband signal 150 caused by the pre-distortion circuit 130. According to some examples, the high frequency component of the baseband signal is complementary to the low frequency component of the baseband signal used within the envelope tracking circuit 220 to change the supply voltage. Turning back to the example illustrated in FIG. 7, for the low frequency component, the operating point is determined according to the gain curve 710 resulting in the operating point 716. For the high frequency component of the baseband signal, i.e. the power related to the fast signal change, however, the required output power may not be provided by means of a change of the supply voltage but by the pre-distortion circuit 130 instead.

While the subsequently described three examples in FIGS. 4A to 4C determine the high frequency component by means of a high-pass filter within the pre-distortion circuit 130, further examples may determine the high frequency component by other means. As already elaborated on before, in some examples, the high frequency component of the baseband signal is complementary to the low frequency component of the baseband signal used within the envelope tracking circuit 220. In other words, all the energy which is filtered out by the low-pass characteristic of the envelope tracking circuit 220 is accumulated and compensated for by the pre-distortion circuit 130 using its high pass. According to some examples, the sum of the low-pass characteristic of the envelope tracking circuit 220 and the high pass within the pre-distortion circuit is ideally an all pass with a linear phase. To achieve this, it may be advantageous to perform a pre-distortion to the phase of the envelope tracking circuit 220 by means of the equalizer 226 to linearize the low-pass characteristic of the envelope tracking circuit 220. Three possible implementations of a pre-distortion circuit 130 are illustrated in FIGS. 4A to 4C.

According to FIG. 4A, the high frequency component of the baseband signal 160 is determined by means of a high-pass filter 410 having a corner frequency matching the corner frequency of the low-pass characteristic of the envelope tracking circuit 220. That is, the high-pass filter 410 provides the change of the instantaneous radius or envelope of the baseband signal that cannot be followed by the envelope tracking path 220. This is one of the input quantities to a look-up table 420. A first delay 402 may be used to compensate for the delays caused by the high-pass filter 410. A second input to the two-dimensional look-up table 420 is the instantaneous radius or the actual envelope itself. While the present radius provides the information of the working point along the presently used gain target curve 702 of the amplifier 110, the high pass delivers the change that is not covered by the envelope tracking path 220 and hence the deviation from the gain target at the present supply voltage, as illustrated in FIG. 7. Combining both information within the look-up table 420, the required modification for the baseband signal 150 is determined within the look-up table 420 in order to avoid a deterioration of the radio frequency signal 150. The determined modification of the baseband signal is added to the baseband signal 160 by means of the adder 406. A further delay element 408 is used to compensate for the time delay caused by the look-up operation using the look-up table 420.

FIG. 4B illustrates a further example of a pre-distorting circuit avoiding a two-dimensional look-up table. The example of FIG. 4B comprises a first look-up table 430 and a second look-up table 432. The first look-up table 430 receives the present baseband signal 150, e.g. its radius component or amplitude, as an input, and provides a first modification to the baseband signal 160 in order to consider a variable gain target, as illustrated by FIGS. 7 and 8. Performing this modification alone would end up with a baseband signal which is not pre-distorted with respect to the high frequency components that cannot be followed by the supply voltage generator or power supply 120. To this end, a high pass filter 434 is used to determine the high frequency component of the baseband signal 160 which cannot be followed by the envelope tracking circuit. The associated further modification of the baseband signal is performed by means of the second look-up table 432 and its associated second adder 436.

A first delay element 438 is used to compensate for the time delay associated to the look-up table operation of the look-up table 430 and the adder 440 is used to perform the first modification of the baseband signal. Likewise, delay elements 442 and 444 are used to compensate for the delays introduced by the high-pass filter 434 and the look-up table 432. The functionality of the high-pass filter 433 together with the look-up table 432 can also be described as to perform the projection from the gain curve 702 with constant supply voltage in FIG. 7 to the horizontal output power axis. When the projections are similar, one single look-up table may be used.

Examples not using the adaption of the gain target for the amplifier 110 may, for example, use a pre-distortion circuit as illustrated in FIG. 4C in order to still appropriately pre-distort the baseband signal 160 with respect to those frequency portions which cannot be followed by the envelope tracking circuit 220. The pre-distortion circuit of FIG. 4C corresponds to the right portion of the pre-distortion circuit of FIG. 4B and reference is herewith made to the description of the corresponding part of the pre-distortion circuit of FIG. 4B in order to avoid redundancies.

In summary, in the pre-distortion circuits illustrated in FIGS. 4A to 4C, the operation mode of the pre-distortion circuit 130 is controlled depending on the bandwidth of the radius of the baseband signal. To this end, the corner frequencies of the high-pass filters may be adjusted according to the present requirements. A further control operation depending on the bandwidth of the baseband signal 160 is, for example, to use different look-up tables 420 and 430 depending on the presently chosen gain target within the pre-distortion circuit. Further, the operation mode of the pre-distortion circuit 130 is controlled depending on the bandwidth of the radius of the baseband signal in that a high frequency portion of the baseband signal is generated within the pre-distortion circuit 130 itself so as to determine the desirable modification of the baseband signal 160 based on the high frequency component, using an associated look-up table 432. To this end, the high-pass filter and the look-up tables 434 and 432 of FIG. 4 or FIG. 4C or FIG. 4B may also be interpreted as a control circuit which is configured to control an operation mode of the pre-distortion circuit 130 depending on the bandwidth of the radius of the baseband signal 160.

As compared to solutions only operating within the envelope tracking path, a pre-distortion circuit 130 within the data path of the baseband signal operating depending on a bandwidth of the radius or on a bandwidth of the baseband signal 160 provides the ability to realize the desired power of the radio frequency signal and to avoid spectral disturbances within the signal which may be caused in conventional envelope tracking systems due to the limited bandwidth of the envelope tracking circuit.

Figure 5:
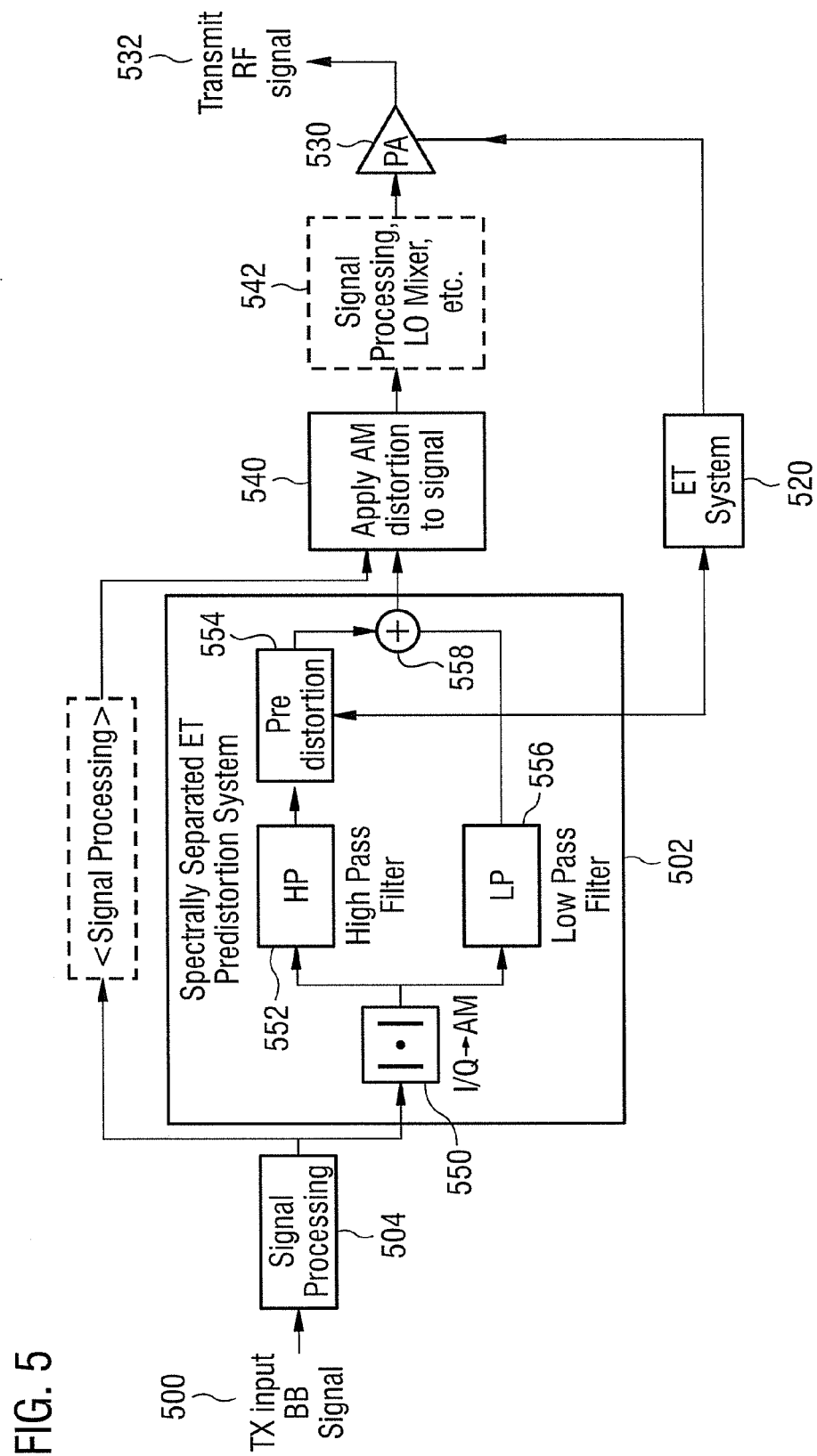
FIG. 5 illustrates a further example for a pre-distortion circuit modifying a high frequency portion of the radius of the baseband signal.
Figure 6:
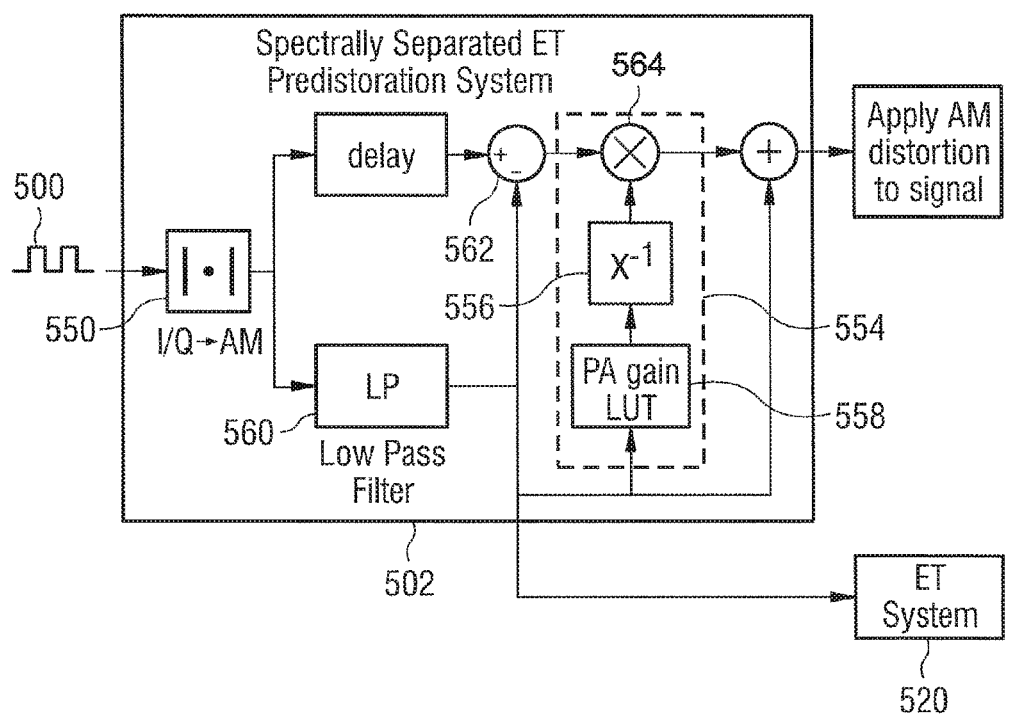
FIG. 6 illustrates a further example for a pre-distortion circuit modifying the high frequency portion of the baseband signal using a scale factor.
Figure 9:
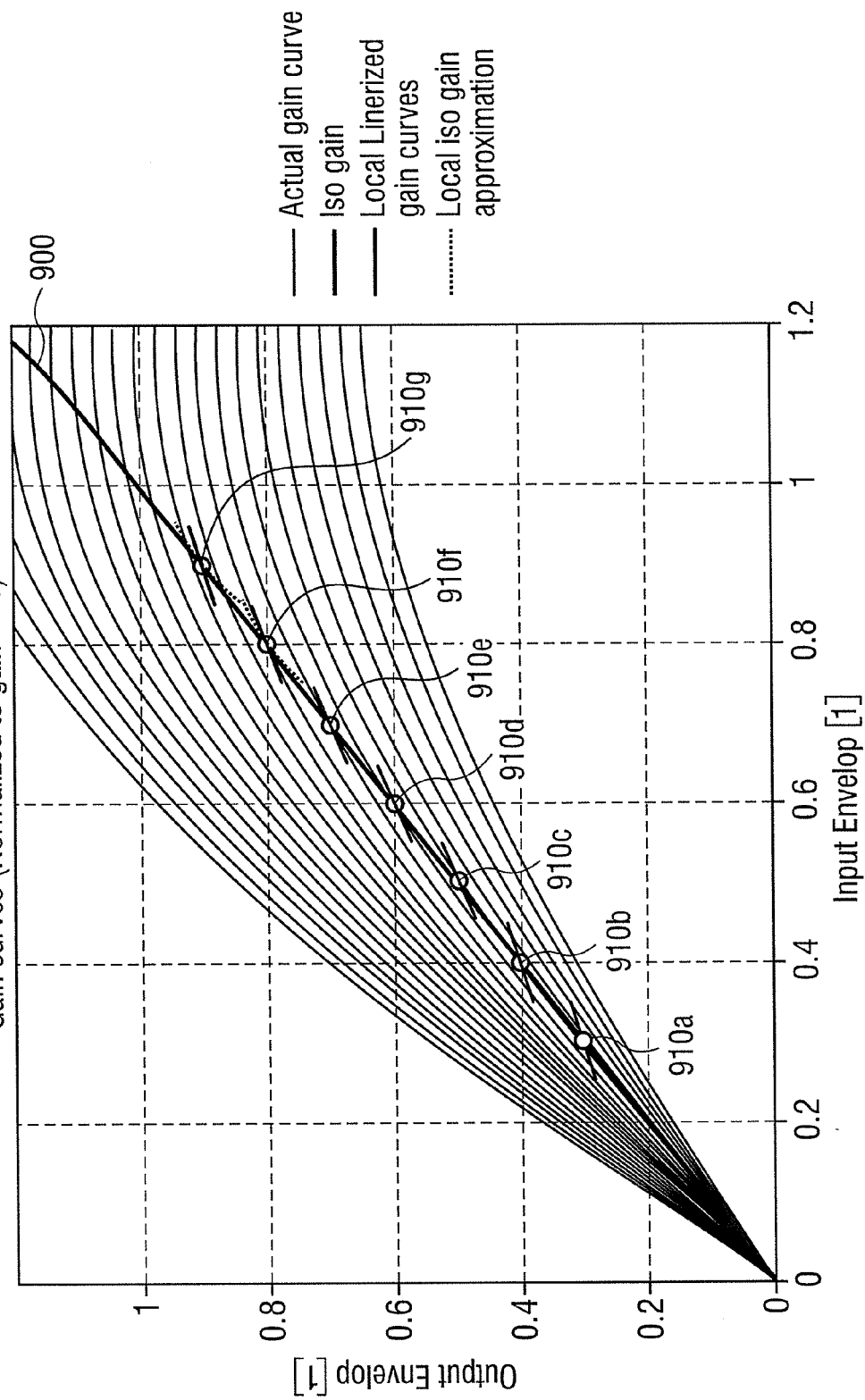
FIG. 9 illustrates an example of gain curves of an amplifier and their dependency on a supply voltage.
Figure 10:
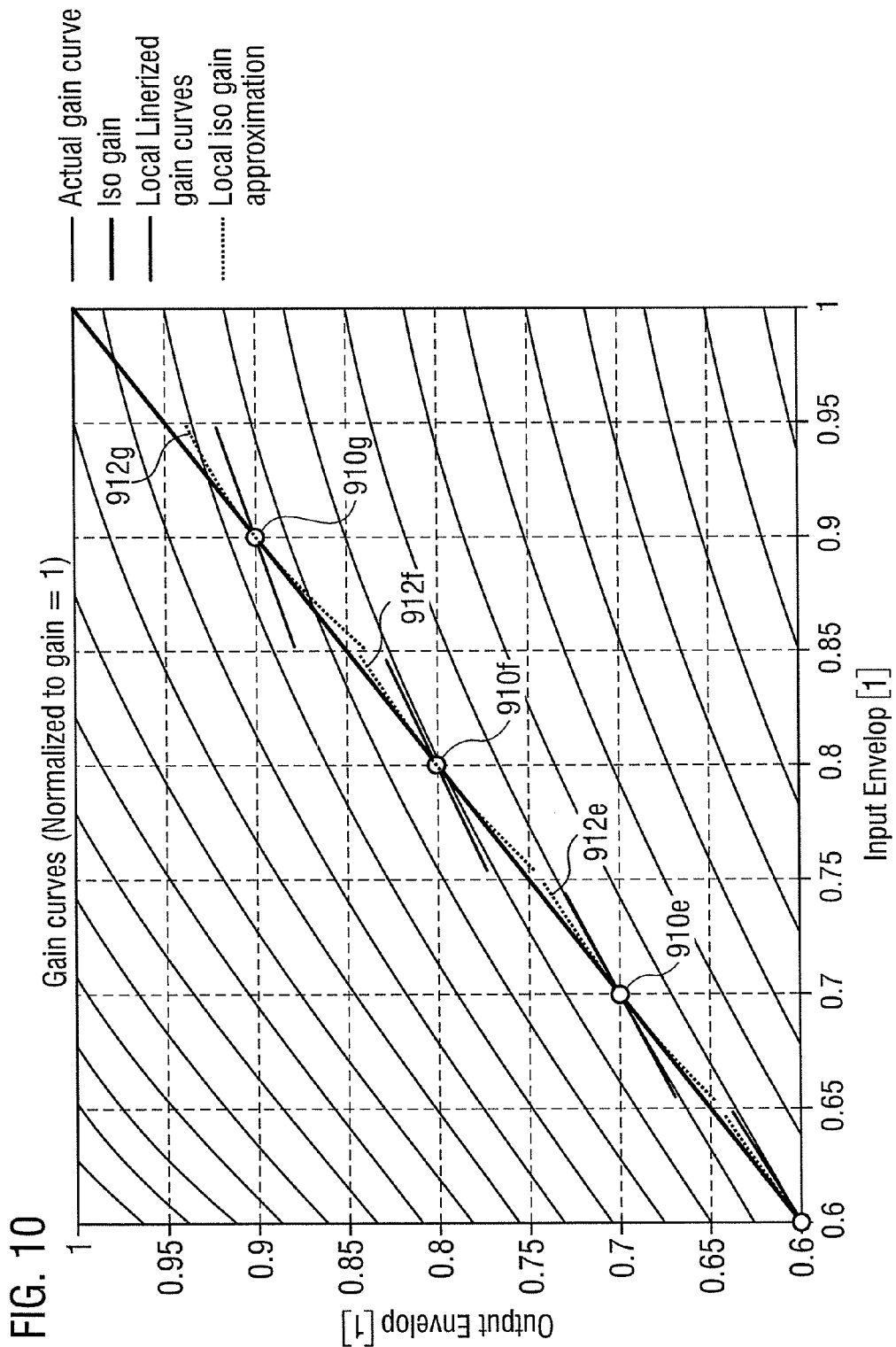
FIG. 10 shows a magnification of a section of FIG. 9.

FIGS. 5 and 6 illustrate further examples as to how an appropriate pre-distortion may be achieved within the data path of the radius signal, i.e. by modifying the baseband signal 500 within the data path. While FIGS. 5 and 6 give two possible implementations of pre-distortion circuits 502, FIGS. 9 and 10 illustrate as to how an appropriate modification of high frequency components within the pre-distortion signals may be derived from the gain characteristic of an amplifier. Like in FIG. 2, the digital data path essentially consists of a basic signal processing or BSP 504 operating on the baseband signal before it is provided to the pre-distortion circuit 502. An envelope tracking circuit 520 performs the envelope tracking and the associated variation of the supply voltage provided to the output power amplifier 530 providing the radio frequency signal 532. The pre-distortion is performed using the baseband signal and modifying the radius components or the envelope of the baseband signal in order to compensate for gain deviations caused by slow intrinsically or deliberately slow envelope tracking circuits 520. Additional signal processing like the application of additional distortions by the signal modifier 540 or possible further signal processing steps, as for example up-mixing the baseband signal to a local oscillator signal by an optional mixer 540 will not be further discussed herein. Instead, the focus is given to the examples described herein, in particular to the pre-distortion circuit 502 used to modify the baseband signal.

Much like what was elaborated on with respect to the embodiments of FIGS. 2, 3 and 4, the example of a pre-distortion circuit 502 as illustrated in FIG. 5 operates on an amplitude modulated baseband signal. In case the signal is not provided as an amplitude-modulated signal, an optional baseband conversion block 550 may be utilized to provide the amplitude-modulated baseband signal for the pre-distortion circuit 502. While the baseband conversion block 550 is illustrated as being part of the pre-distortion circuit 502, further embodiments may completely disregard the block or the block may not be part of the pre-distortion circuit 502 and implemented as a preceding signal processing block. In the embodiment of FIG. 5, the pre-distortion or modification of the baseband signal is not only based on the high frequency component of the baseband signal. Rather, a high frequency portion of the baseband signal is generated by means of a high-pass filter 552 and the modification is only performed on the high frequency portion of the baseband signal, using a pre-distortion block 554. In parallel, a low frequency portion of the baseband signal is generated by means of the low-pass filter 556, the low-pass filter 556 and the high-pass filter 552 being complementary to each other, i.e. their sum being an all pass. The modified high frequency portion of the baseband signal and the low frequency portion of the baseband signal are added by means of an adder 558 so as to generate the baseband signal with the full spectrum being appropriately modified so as to avoid the generation of noise components within the power density spectrum of the resultant radio frequency signal 532.

The pre-distortion block 554 is only illustrated in a conceptual view in FIG. 5. FIG. 6 illustrates an example with a practical implementation of the pre-distortion block 554. The pre-distortion block 554 comprises a look-up table 558 to determine a correction factor or scale factor 556 to be applied to the high frequency portion of the baseband signal by means of a multiplier 564. The scale factor 556 as provided by the look-up table 558 depends on the present operating point of the amplifier 530 and, hence, on the supply voltage provided by the envelope tracking circuit 520. The envelope tracking circuit operates on the low frequency portion of the baseband signal providing for controllable low frequency characteristics of the envelope tracking circuit 520.

The example of FIG. 6 further illustrates a practical implementation as to how to achieve complementary low frequency portions and high frequency portions of the baseband signal 500. In the example of FIG. 6, the low frequency portion is generated using the low-pass filter 560 and the high frequency portion is generated by subtracting the low frequency portion from the full bandwidth baseband signal by means of the adder 562 automatically arriving at two complementary signal portions or two complementary filter characteristics. As elaborated on before, the low frequency portion 560 is used as an input to the envelope tracking circuit 520 as well as an input to the pre-distortion circuit 554. The operation mode of the pre-distortion circuit is controlled using information on the low frequency portion of the baseband signal so as to consider the impact of the envelope tracking circuit 520 which also depends on the low frequency portion of the baseband signal.

The examples illustrated in FIGS. 5 and 6 can be summarized as to actively limit the bandwidth of the signal which is used for the envelope tracking to be able to provide for a precisely complementary characteristic used within the pre-distortion of the high frequency components within the pre-distortion circuit and the low frequency components being used to determine the supply voltage for the amplifier.

Due to the limited bandwidth of the signal used for the envelope tracking, the envelope tracking system is enabled to operate with lower bandwidth and, hence, more efficiently. Furthermore, a pre-distortion is introduced into the high frequency portions of the amplitude modulated baseband signal. Since the filter characteristics of the low-pass and the associated high-pass are complementary, the signal components which cannot be followed by the envelope tracking system are pre-distorted within the pre-distortion circuit.

According to some examples, the envelope tracking circuit is actively band limited using a known low-pass filter characteristic. The pre-distortion circuit operates only on the high frequency component while the low frequency component of the baseband signal is used to determine the modification or pre-distortion of the high-frequency component depending on the low frequency component of the baseband signal. The envelope tracking circuit together with the low frequency component of the baseband signal input into the power amplifier 530 defines the operating point of the power amplifier 530. At this operating point, the power amplifier 530 has known characteristics. The high frequency component of the input amplitude or baseband signal is small compared to the low-frequency component of the baseband signal. The high frequency component is amplified with the characteristics of the amplifier at the operating point, which depends on the low frequency component. The pre-distortion circuit 502 alters or modifies the high frequency component of the amplitude modulated baseband signal such that, given the known characteristics of the power amplifier 530 at the chosen operation point, the output signal of the power amplifier 530, i.e. the radio frequency signal 532 has the desired qualities, in particular in terms of power spectral density. The operation point is defined by the low frequency component of the amplitude modulated baseband signal and by the envelope tracking circuit 520, which are coupled to each other over the envelope tracking circuit's logic. The operating point is dynamically changing and so is the modification of the baseband signal by the pre-distortion circuit 502. In other words, an operation mode of the pre-distortion circuit is controlled depending on a bandwidth of a radius of the baseband signal or depending on a radius/amplitude of the amplitude modulated baseband signal.

Determining the high frequency components and the low frequency components as complementary components of the full band with baseband signal as illustrated in FIG. 5 or 6, may allow to reduce the bandwidth of the envelope tracking circuit 520 without introducing additional noise to the generated or transmitted radio frequency signals 532 at the end of the signal processing chain.

Using an envelope tracking 520 in an example described herein provides for the possibility to operate the power amplifier 530 in compression for a wide range of input amplitudes. The basic idea is to dynamically adapt the bias or supply voltage of the power amplifier 530 depending on the input amplitude (envelope) of the amplitude modulated baseband signal. According to some approaches, the bias values are chosen such that the power amplifier 530 delivers a constant gain independent of the input to the power amplifier while keeping the power amplifier in compression for a large portion of the input amplitude range. However, the amplitude modulated baseband signal and all signals derived from the amplitude modulated signal of a normal transmit signal (for example according to some of the LTE transmission standards) is not band limited. Due to the nonlinear relationship between the magnitude of the signal and the signal itself, it is nearly impossible to operate on the magnitude or radius of the signal without introducing errors to the transmitted signals. Therefore, conventional envelope tracking systems need to be designed for very wide band signals in order to reach the required noise performance of the transmitter.

In other words, according to the examples described herein, the amplitude modulated signal used for the envelope tracking circuit can be band limited without introducing any additional noise through the generated radio frequency signals, enabling better performance of the envelope tracking circuit, lower power consumption and cheaper components within the radio frequency signal processing chain. As illustrated in FIGS. 5 and 6, it is proposed to low-pass filter the AM part of the transmit signal. The envelope tracking system gets the low-pass filtered AM signal as an input. A high-pass filtered AM signal containing the AM error of the low-pass filtered AM signal is calculated. The high-pass AM signal is pre-distorted using the gain characteristics of the power amplifier for the given system using the particular implementation of the envelope tracking circuit and the power amplifier used. That is, the pre-distortion of the high-pass AM signal is based on the low-pass signal. The low-pass AM signal defines the operation point of the power amplifier and the high-pass AM signal is treated as a small signal at this operation point. That is, the power amplifier characteristics used for the pre-distortion are determined using the low frequency portion of the baseband signal. If the gain characteristics of the power amplifier are known at each operating point, the high-pass signal can be pre-distorted such that the resulting signal (the pre-distorted high-pass AM signal+the low-pass AM signal processed by the power amplifier at an operating point determined by the envelope tracking system) has the desired qualities. One particular approach to achieve the approximation of the power amplifier's gain is to assume that the gain is constant close to the operating point as determined by the envelope tracking circuit. Since the envelope tracking circuit is designed to determine the target gain for the power amplifier such that it is correct for the low-pass AM signal, the high-pass AM signal can be multiplied by a value or scaling factor (specific to the low-pass AM signal value). The low-pass AM and the pre-distorted high-pass AM signals are added together to form the AM signal which will be seen by the power amplifier input.

A linear gain approximation in the proximity of the low-pass signal magnitude leads to a pre-distortion which is essentially defined by the division of the present gain of the power amplifier for the given low-pass AM signal. The power amplifier gain for the given low-pass signal may, for example, be stored within a look-up table, as illustrated in FIG. 6. In a further implementation, another kind of determination of the power amplifier gain for the given amplitude of the low-pass baseband signal can be chosen, for example using a polynomial based approach of approximating the gain in the proximity of the operating point. Likewise, the polynomial approximation may be stored in look-up tables for a more efficient implementation in hardware. The pre-distortion algorithm can be made arbitrarily good, in particular by increasing the accuracy of the gain curve approximations. Further examples may use piece-wise linear approximations or higher order polynomial models, i.e. approximating the gain curve in the vicinity of an operating point of the low frequency portion of the baseband signal by higher order polynomials, for example, polynomials of second, third or fourth order. The pre-distorted high-pass and low-pass AM signals are added together and applied again to the transmit signal. For a polar transmitter architecture, the pre-distortion can be integrated into the AM signal path. For an I/Q transmitter architecture, the I/Q signal has to be rescaled such that the signal radius fits to the pre-distortion AM signal.

While FIGS. 5 and 6 use the same band limited low-pass AM signal as an input to the envelope tracking circuit 520 and within the pre-distortion circuit 502, two parallel low-pass filters may alternatively be used. Those parallel low-pass filters may have similar characteristics for the envelope tracking circuit 520 as well as for the pre-distortion circuit 502.

FIGS. 9 to 14 illustrate some signal characteristics achievable by examples described herein in comparison to conventional approaches. The illustrations in FIGS. 9 to 14 are based on an LTE 20 MHz signal and have one free parameter which is equivalent to the power amplifier's bias, i.e. the supply voltage provided to the power amplifier 530.

FIG. 9 illustrates, in the X-axis, the input envelope, i.e., the power of the input signal to the power amplifier 530, and on the Y-axis the output envelope, i.e. the energy of the radio frequency or transmit signal 532 as generated by the power amplifier 530. An input envelope to gain parameter mapping was defined so as to achieve an iso gain curve with a gain equal to unity for the purpose of the illustration. Each of the curves within the illustration of FIG. 9 represents an input/output mapping for one parameter value. That is, each of the curves relates the input envelope to the output envelope for a given supply voltage. The solid line graph 900 illustrates the desired behavior of the envelope tracking and power amplifier system with a target gain of one. Some large signal iso gain points 910a to 910g are illustrated. The large signal iso gain points 910a and 910g are the gain points chosen by the envelope tracking system based on the low-frequency portion of the baseband signal. The small signal gains in the proximity of the large signal gain points 910a to 910g are illustrated by means of short green lines, assuming a linear approximation of the gain curve in the vicinity of a large signal gain point. For illustration purposes, a magnification of a section of FIG. 9 is illustrated in FIG. 10. The section-wise curved lines 912e to 912g illustrate the real system behavior resulting from the linear approximation of the gain in the vicinity of the iso gain points 910e to 910 g. As it becomes apparent from FIG. 10, due to the non-linear gain, a linear approximation of the gain results with a minor remaining error, depending on the distance from one of the iso gain operation points 910e to 910g. A higher order gain approximation, like for example a piece-wise linear gain or a polynomial gain approximation leads to a reduction of the remaining error which can be made arbitrarily small.

Figure 11:
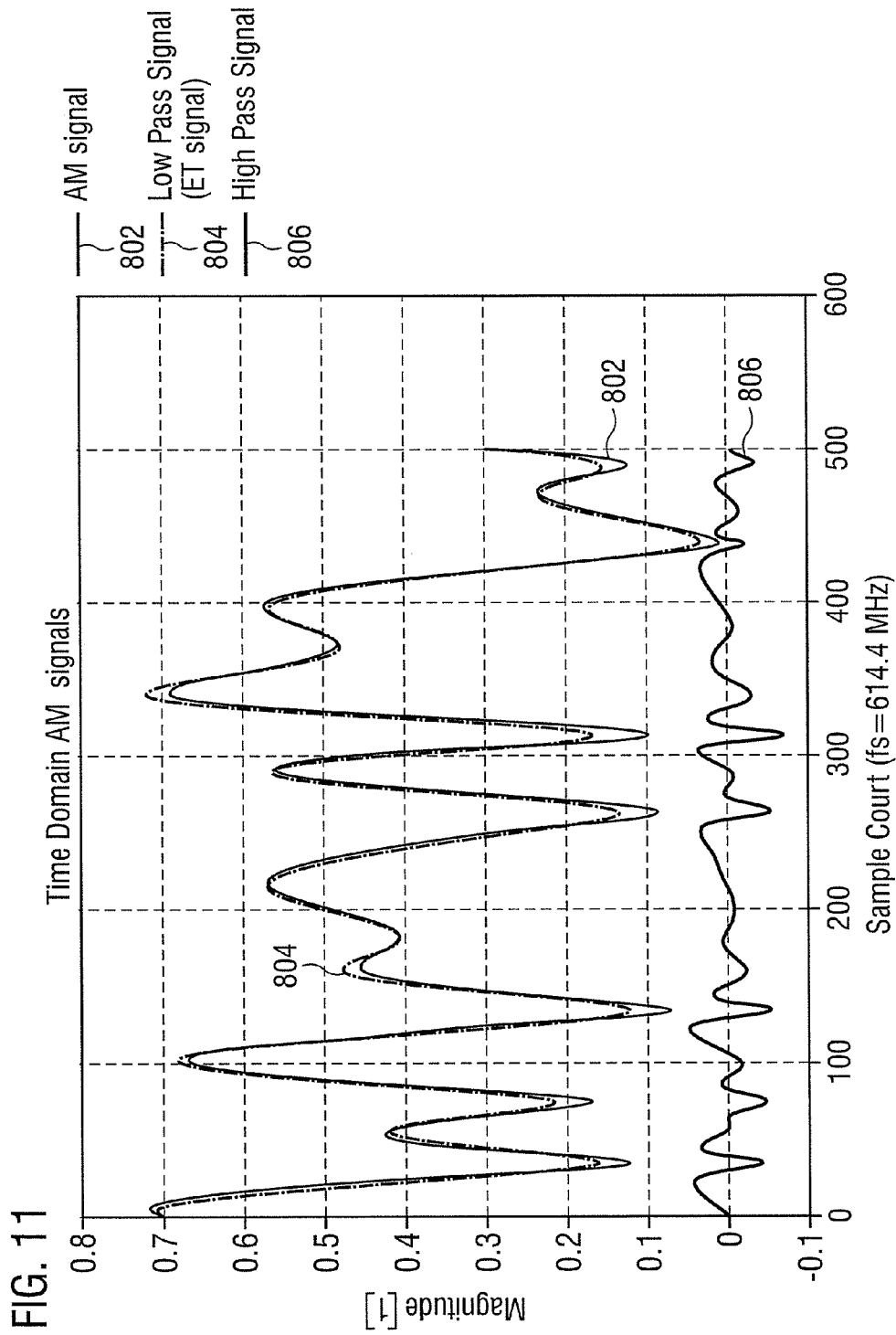
FIG. 11 illustrates an example of a low frequency and a high frequency contribution to a radius of a baseband signal.
Figure 12:
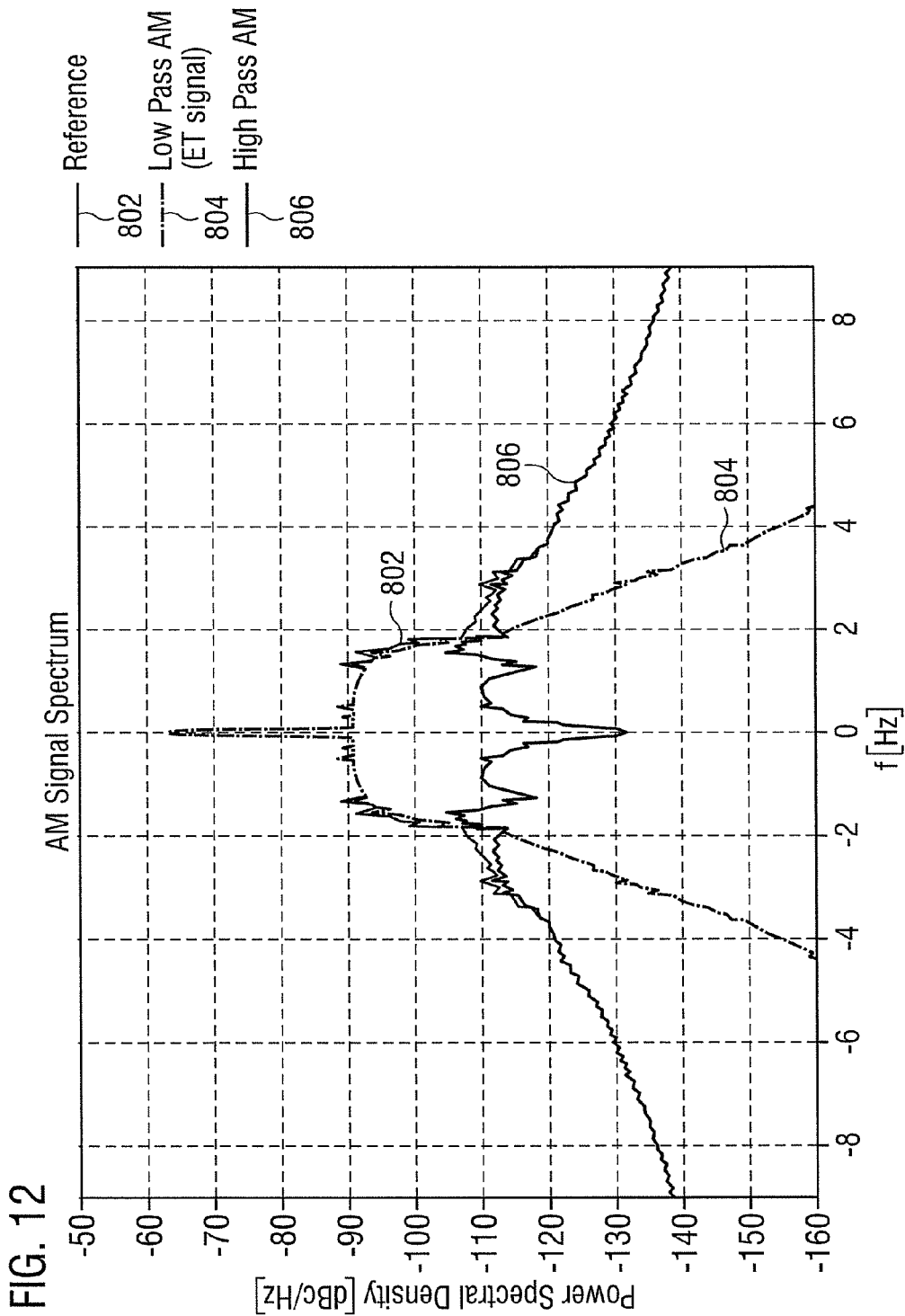
FIG. 12 illustrates spectra of the signals illustrated in FIG. 11.

FIG. 11 illustrates a particular example of a corresponding pair of high and low-pass filters within the pre-distortion circuit and illustrates the baseband signal and the signal portions generated by the filters. The AM signal, i.e. the radius of the baseband signal, is illustrated by the curve 802, the low-pass filtered AM signal is illustrated by the curve 804 and the high-frequency portion of the baseband signal is illustrated by the curve 806. In the example, the cutoff frequency of the low-pass filter is chosen such that the amplitude of the high-pass signal, i.e. of the high frequency portion of the baseband signal is small as compared to the low frequency portion of the AM signal. For example, for a LTE 20 MHz signal, a cutoff frequency of 20 to 30 MHz seems appropriate. A power spectral density of the three signals illustrated in FIG. 11 is illustrated in FIG. 12, where the same reference numbers are given for the same signals, although different signal characteristics may be illustrated in FIGS. 11 and 12. The low frequency portion of the baseband signal, i.e. the signal used for the envelope tracking circuit, is nicely band limited as it becomes apparent from FIG. 12.

Figure 13:
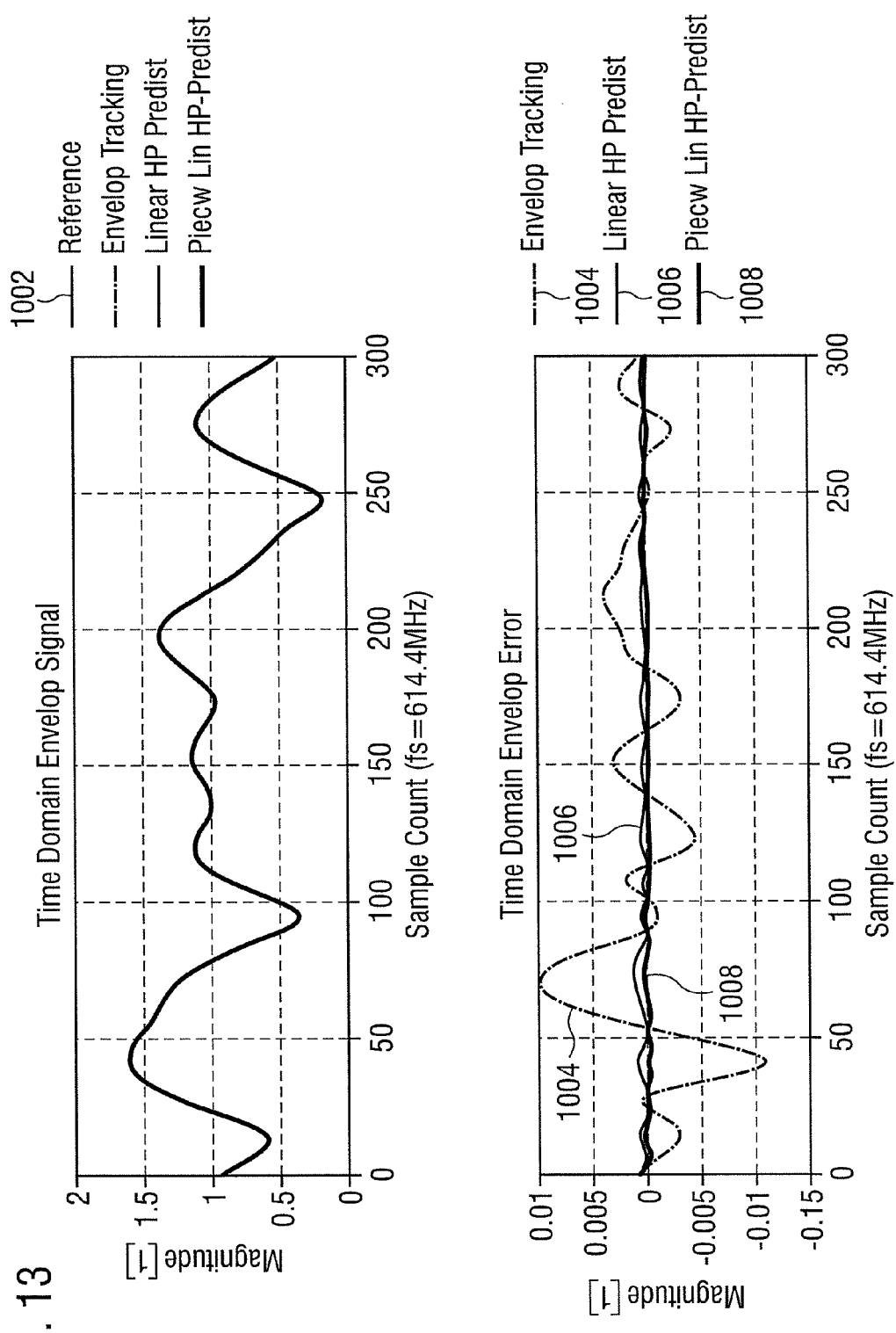
FIG. 13 illustrates an illustration of envelopes of radio frequency signals and error contributions within the radio frequency signal for different pre-distortion schemes.
Figure 14:
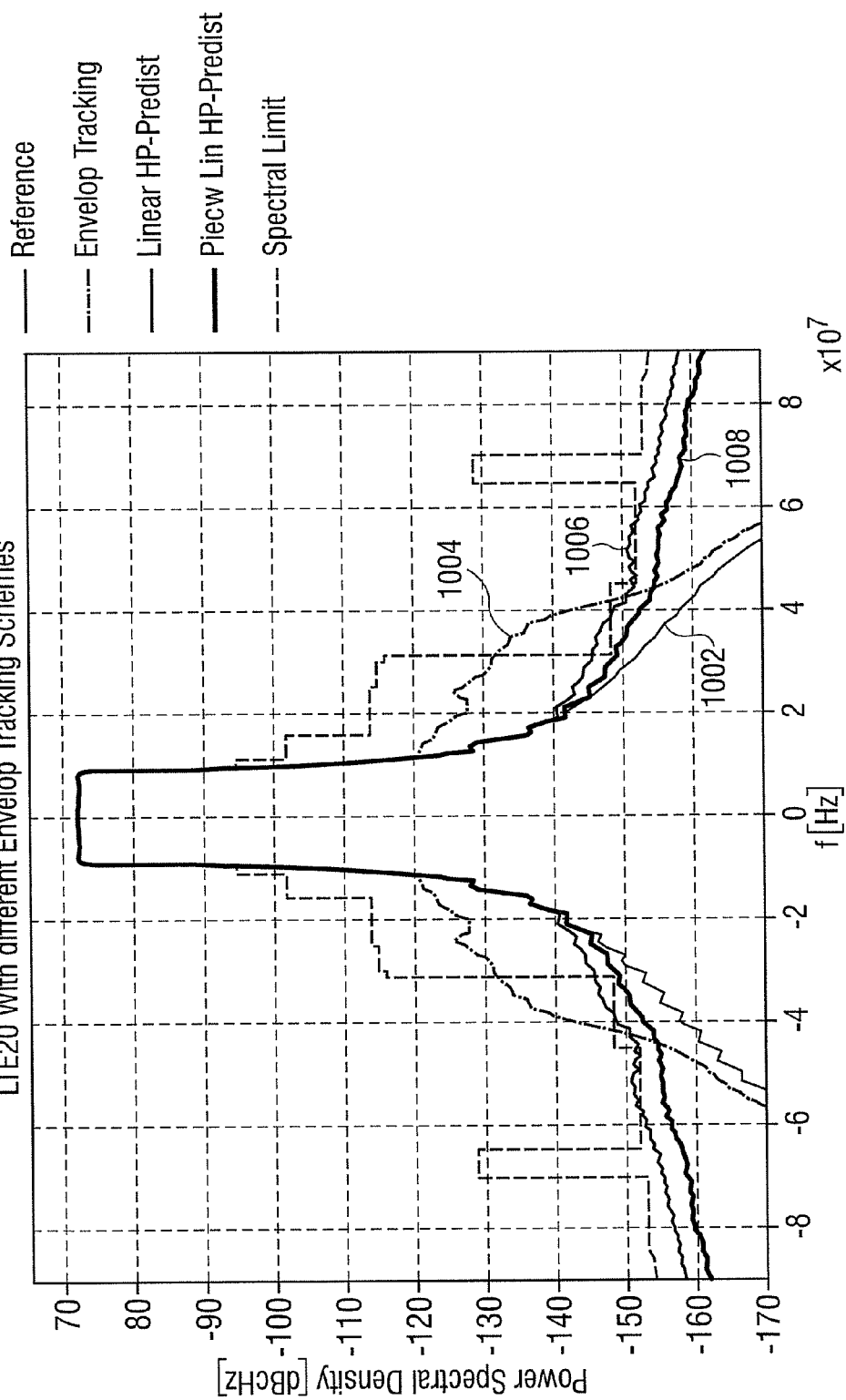
FIG. 14 illustrates the spectrum of the signals generated by the pre-distortion schemes illustrated in FIG. 13.

FIGS. 13 and 14 compare the achieved results for examples using different approximation schemes to the gain curve of the power amplifier in the vicinity of the operation points determined for the low frequency portion of the baseband signal. FIG. 13 illustrates, in the upper plot, the envelope of the signal resulting from different pre-distortion schemes. Likewise, FIG. 14 illustrates power full spectral density of the resultant signals for the same pre-distortion schemes so that identical reference numbers are given for the curves associated with the identical pre-distortion schemes.

The upper plot of FIG. 13 shows the magnitude of the resulting radio frequency signal in terms of absolute values, where the deviations from a reference 1002 are hardly visible. However, in the lower plot, the deviation from the reference 1002 is illustrated in magnification, making differences in the resulting quality of the signal apparent. An LTE20 spectrum with no pre-distortion and ideal iso gain curve is taken as a reference and the deviations from this reference spectrum are illustrated in the lower plot. The curve 1004 corresponds to envelope tracking using a low-pass AM signal and no additional pre-distortion, which corresponds to conventional implementations. Curve 1006 is the result of envelope tracking together with a pre-distortion based on the bandwidth of the baseband signal using linear gain approximation as illustrated in FIGS. 9 and 10. Curve 1008 illustrates the result using pre-distortion with a piecewise linear gain approximation, in particular a gain approximation using one gain value for positive deviations and one gain value for negative deviations from the gain curve.

FIGS. 13 and 14 provide proof that the signal quality and the power density spectrum of the radio frequency signal can be significantly enhanced using pre-distortion based on the bandwidth of the baseband signal. In particular, the difference between the curve 1006 and 1008 indicates that the noise performance can be further improved by introducing more accurate gain approximation schemes. To this end, using examples as described herein may allow to limit the bandwidth of the envelope tracking circuit without causing any additional distortions into the signal generated by means of envelope tracking.

Figure 15:
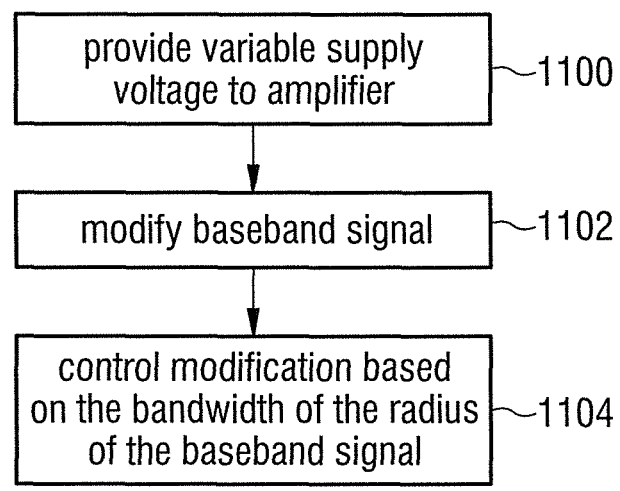
FIG. 15 illustrates a block diagram of an example of a method for generating a radio frequency signal.

FIG. 15 illustrates a block diagram of an example of a method for generating a radio frequency signal depending on a baseband signal using an amplifier. In 1100, a variable supply voltage is provided to the amplifier. In 1102, the baseband signal is modified. In 1104, the modifying of the baseband signal is controlled depending on a bandwidth of a radius of the baseband signal.

Figure 16:
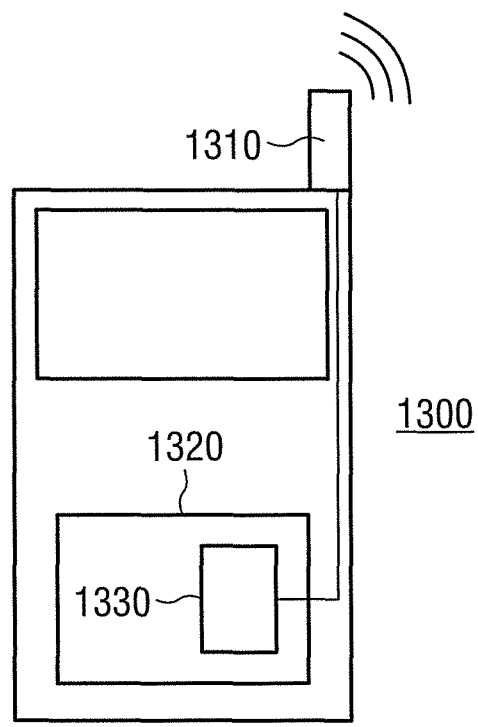
FIG. 16 schematically illustrates a mobile telecommunications device.

FIG. 16 schematically illustrates a mobile telecommunications device or mobile handset 1300 comprising a transmitter 1320 to generate a radio frequency signal to be transmitted by means of an antenna 1310 of the mobile telecommunications device 1300. The transmitter 1320 comprises a circuit 1330 for generating the radio frequency signal.

Example 1 is a circuit for generating a radio frequency signal, comprising an amplifier configured to provide a radio frequency signal, the radio frequency signal being based on a baseband signal; a power supply configured to provide a variable supply voltage to the amplifier; a predistortion circuit configured to modify the baseband signal; and a control circuit configured to control an operation mode of the predistortion circuit depending on a bandwidth of a radius of the baseband signal.

In example 2, in the circuit of example 1, the control circuit is configured to control the operation mode of the predistortion circuit using information on a low frequency portion of the radius of the baseband signal.

In example 3, in the circuit of example 1 or 2, the control circuit is configured to control an amount of the modification by the predistortion circuit.

In example 4, in the circuit of example 3, the control circuit is configured to increase the amount of the modification if the bandwidth of the radius of the baseband signal increases.

In example 5, in the circuit of any of the preceding examples, the predistortion circuit is configured to modify the radius of the baseband signal.

In example 6, in the circuit of any of the preceding examples, the control circuit is configured to control the operation mode of the predistortion circuit such that an energy variation within the radio frequency signal caused by the variation of the supply voltage is compensated by an energy variation within the baseband signal caused by the predistortion circuit.

In example 7, the circuit of any of the preceding examples optionally further comprises an envelope tracking circuit configured to control the power supply based on the radius of the baseband signal.

In example 8, in the circuit of example 7, the envelope tracking circuit is configured to control the power supply based on a low frequency component of the radius of the baseband signal.

In example 9, the circuit of example 8 optionally further comprises a low pass filter within the envelope tracking circuit to provide the low frequency component of the radius of the baseband signal.

In example 10, in the circuit of any of examples 7 to 9, the envelope tracking circuit is configured to switch the power supply from a first operation mode to a second operation mode if the bandwidth of the radius of the baseband signal exceeds a threshold, wherein the power supply operates with a lower bandwidth and a higher efficiency in the first operation mode.

In example 11, in the circuit of any of examples 8 to 10, the predistortion circuit is configured to determine the modification of the baseband signal using a high frequency component of the radius of the baseband signal, the high frequency component of the radius of the baseband signal being complementary to the low frequency component of the radius of the baseband signal.

In example 12, the circuit of example 11 optionally further comprises a high pass filter within the predistortion circuit to provide the high frequency component of the radius of the baseband signal.

In example 13, in the circuit of examples 11 or 12, the control circuit is configured to control the operation mode of the predistortion circuit using an approximation to a gain curve of the amplifier, the gain curve depending on the supply voltage.

In example 14, in the circuit of example 13, the approximation is linear.

In example 15, in the circuit of example 14, the predistortion circuit is configured to scale the high frequency of the radius of the baseband signal component using the approximation to the gain curve.

In example 16, in the circuit of any of the preceding examples, the predistortion circuit is configured to modify only a high frequency portion of the radius of the baseband signal.

In example 17, in the circuit of example 16, the predistortion circuit optionally comprises a high pass filter configured to provide the high frequency portion of the radius of the baseband signal; a low pass filter configured to provide a complementary low frequency portion of the of the radius baseband signal; a modifier configured to provide a modified high frequency portion of the radius of the baseband signal using the high frequency portion of the baseband signal; and a signal combiner configured to combine the low frequency portion of the radius of the baseband signal and the modified high frequency portion of the radius of the baseband signal.

In example 18, in the circuit of any of the preceding examples, the control circuit is configured to control the operation mode of the predistortion circuit depending on an instantaneous bandwidth of the radius of the baseband signal.

Example 19 is a method for generating a radio frequency signal depending on a baseband signal using an amplifier, comprising: providing a variable supply voltage to the amplifier; modifying the baseband signal; and controlling the modifying of the baseband signal depending on a bandwidth of a radius of the baseband signal.

In example 20, the method of example 19 optionally further comprises: determining a high frequency component of the radius of the baseband signal; wherein the baseband signal is modified based on the high frequency component of the radius of the baseband signal.

Example 21 is a transmitter comprising a circuit for generating a radio frequency signal according to any of examples 1 to 18.

Example 22 is a mobile handset comprising a transmitter according to example 21.

Example 23 is means for providing a radio frequency signal, comprising: means for providing the radio frequency signal based on a baseband signal; means for providing a variable supply voltage to the means for providing the radio frequency signal; means for modifying the baseband signal; and means for controlling an operation mode of the means for modifying depending on a bandwidth of a radius of the baseband signal.

In example 24, in the means for providing of example 23, the means for modifying determines the modification of the baseband signal using a high frequency component of the radius of the baseband signal.

Example 25 is a computer program having a program code configured to perform a method according to any of examples 19 or 20 when the program code is executed on or by a processor.

Example 26 is a computer readable storage medium having stored thereon a program code configured to perform a method according to any of examples 19 to 20, when the program code is executed on or by a processor.

While the examples described herein have been discussed in relation to mobile telecommunication applications, in particular with respect to LTE systems, further examples may be implemented for other wireless or wired signal transmission systems or communication networks to provide the benefits discussed herein. Examples for further transmission systems are systems operating according to another one of the 3GPP-standardized mobile communication networks or mobile communication systems. Such mobile or wireless communication system may correspond to, for example, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM) or Enhanced Data rates for GSM Evolution (EDGE) network, a GSM/EDGE Radio Access Network (GERAN), or mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc. Further examples of receiver systems or tuning circuits may also be used in connection with other wireless communication standards or protocols, such as for example Bluetooth, ZIGBEE or the like.

Example embodiments may further provide a computer program having a program code for performing one of the above methods, when the computer program is executed on a computer or processor. A person of skill in the art would readily recognize that steps of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A circuit for generating a radio frequency signal, comprising:

an amplifier configured to provide a radio frequency signal, the radio frequency signal being based on a baseband signal having a high frequency portion and a low frequency portion;

a power supply configured to provide a variable supply voltage to the amplifier;

a predistortion circuit configured to modify the baseband signal; and a control circuit configured to control an operation mode of the predistortion circuit depending on a bandwidth of a radius of the baseband signal, wherein the predistortion circuit, under control of the control circuit, is configured to provide a first level of distortion to the high frequency portion of the baseband signal, and a second, different level of distortion to the low frequency portion of the baseband signal.

2. The circuit of claim 1, wherein the control circuit is configured to control the amount of predistortion of the predistortion circuit using information on the low frequency portion of the radius of the baseband signal.

3. The circuit of claim 1, wherein the first level of distortion of the high frequency portion of the baseband signal is greater than the second level of distortion of the low frequency portion of the baseband signal.

4. The circuit of claim 1, wherein the control circuit is configured to increase the amount of the predistortion if the bandwidth of the radius of the baseband signal increases.

5. The circuit of claim 1, wherein the predistortion circuit is configured to modify the radius of the baseband signal.

6. The circuit of claim 1, wherein the control circuit is configured to control the amount of predistortion of the predistortion circuit such that an energy variation within the radio frequency signal caused by the variation of the supply voltage is compensated by an energy variation within the baseband signal caused by the predistortion circuit.

7. The circuit of claim 1, further comprising an envelope tracking circuit configured to control the power supply based on the radius of the baseband signal.

8. The circuit of claim 7, wherein the envelope tracking circuit is configured to control the power supply based on a low frequency component of the radius of the baseband signal.

9. The circuit of claim 8, further comprising a low pass filter within the envelope tracking circuit to provide the low frequency component of the radius of the baseband signal.

10. The circuit of claim 7, wherein the envelope tracking circuit is configured to switch the power supply from a first operation mode to a second operation mode if the bandwidth of the radius of the baseband signal exceeds a threshold, wherein the power supply operates with a lower bandwidth and a higher efficiency in the first operation mode.

11. The circuit of claim 8, wherein the predistortion circuit is configured to determine the modification of the baseband signal using a high frequency component of the radius of the baseband signal, the high frequency component of the radius of the baseband signal being complementary to the low frequency component of the radius of the baseband signal.

12. The circuit of claim 11, further comprising a high pass filter within the predistortion circuit to provide the high frequency component of the radius of the baseband signal.

13. The circuit of claim 11, wherein the control circuit is configured to control the operation mode of the predistortion circuit using an approximation to a gain curve of the amplifier, the gain curve depending on the supply voltage.

14. The circuit of claim 13, wherein the approximation is linear.

15. The circuit of claim 14, wherein the predistortion circuit is configured to scale the high frequency of the radius of the baseband signal component using the approximation to the gain curve.

16. The circuit of claim 1, wherein the second level of distortion of the low frequency portion of the baseband signal is zero, therefore only adding predistortion to the high frequency portion of the baseband signal.

17. The circuit of claim 1, wherein the control circuit is operable to control the operation mode of the predistortion circuit depending on an instantaneous bandwidth of the radius of the baseband signal.

18. A circuit for generating a radio frequency signal, comprising:
  an amplifier configured to provide a radio frequency signal, the radio frequency signal being based on a baseband signal;
  a power supply configured to provide a variable supply voltage to the amplifier;
  a predistortion circuit configured to modify the baseband signal;
  a control circuit configured to control an operation mode of the predistortion circuit depending on a bandwidth of a radius of the baseband signal;
  a predistortion circuit configured to modify only a high frequency portion of the radius of the baseband signal;
  wherein the predistortion circuit comprises a high pass filter configured to provide the high frequency portion of the radius of the baseband signal;
  a low pass filter configured to provide a complementary low frequency portion of the radius of the baseband signal;
  a modifier configured to provide a modified high frequency portion of the radius of the baseband signal using the high frequency portion of the baseband signal; and
  a signal combiner configured to combine the low frequency portion of the radius of the baseband signal and the modified high frequency portion of the radius of the baseband signal.

19. A method for generating a radio frequency signal depending on a baseband signal using an amplifier, comprising:
  providing a variable supply voltage to the amplifier;
  modifying the baseband signal using a predistortion circuit;
  controlling the modifying of the baseband signal depending on a bandwidth of a radius of the baseband signal using a control circuit; and
  determining a high frequency component of the radius of the baseband signal,
  wherein the baseband signal is modified by the predistortion circuit based on the high frequency component of the radius of the baseband signal.

* * * * *